United States Patent
Tanaka et al.

(10) Patent No.: US 6,750,423 B2
(45) Date of Patent: Jun. 15, 2004

(54) LASER IRRADIATION METHOD, LASER IRRADIATION APPARATUS, AND METHOD OF MANUFACTURING A SEMICONDUCTOR DEVICE

(75) Inventors: Koichiro Tanaka, Atsugi (JP); Tomoaki Moriwaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/279,054

(22) Filed: Oct. 24, 2002

(65) Prior Publication Data

US 2003/0080099 A1 May 1, 2003

(30) Foreign Application Priority Data

Oct. 25, 2001 (JP) .................................... 2001-327196
Oct. 25, 2001 (JP) .................................... 2001-327208

(51) Int. Cl.[7] ........................................ B23K 26/073
(52) U.S. Cl. ................................................ 219/121.73
(58) Field of Search ...................... 219/121.73, 121.74, 219/121.75, 121.76, 121.77, 121.61, 121.62; 385/33, 24; 257/E21.134, E21.324, E21.347; 438/96, 97

(56) References Cited

U.S. PATENT DOCUMENTS

| | | | |
|---|---|---|---|
| 4,726,849 A | * | 2/1988 | Murata et al. ............... 136/244 |
| 5,854,803 A | | 12/1998 | Yamazaki et al. |
| 5,869,803 A | * | 2/1999 | Noguchi et al. ....... 219/121.62 |
| 5,959,779 A | * | 9/1999 | Yamazaki et al. .......... 359/624 |
| 6,055,346 A | * | 4/2000 | Godard et al. ................ 385/33 |
| 6,393,042 B1 | | 5/2002 | Tanaka |
| 6,567,219 B1 | | 5/2003 | Tanaka |
| 6,573,162 B2 | | 6/2003 | Tanaka et al. |
| 2003/0035219 A1 | * | 2/2003 | Tanaka ....................... 359/618 |

FOREIGN PATENT DOCUMENTS

| JP | 08-195357 | 7/1996 |
|---|---|---|
| JP | 08-309574 | 11/1996 |

* cited by examiner

*Primary Examiner*—Kiley Stoner
*Assistant Examiner*—Jonathan Johnson
(74) *Attorney, Agent, or Firm*—Eric J. Robinson; Robinson Intellectual Property Law Office, P.C.

(57) ABSTRACT

In the present invention, each laser light emitted from a plurality of lasers is divided, and laser light including at least one laser light that is emitted from a different laser and that has different energy distribution is synthesized with another such laser light, or laser light including at least one laser light that has different energy distribution is synthesized with another such laser light through a convex lens that is set at an angle to the direction each laser light travels, to form laser light having excellent uniformity in energy distribution.

56 Claims, 25 Drawing Sheets

Top view
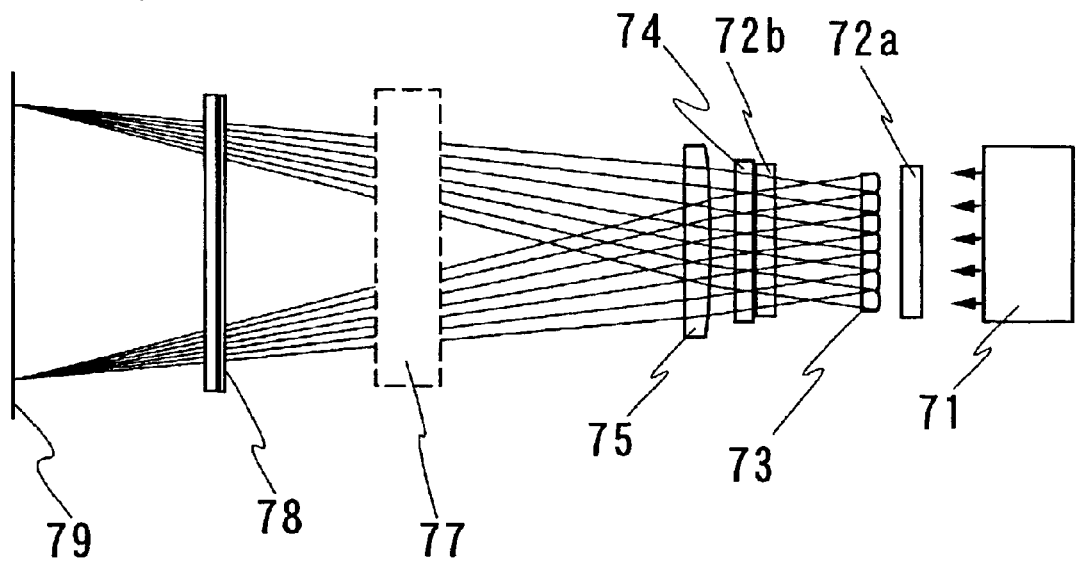
Side view
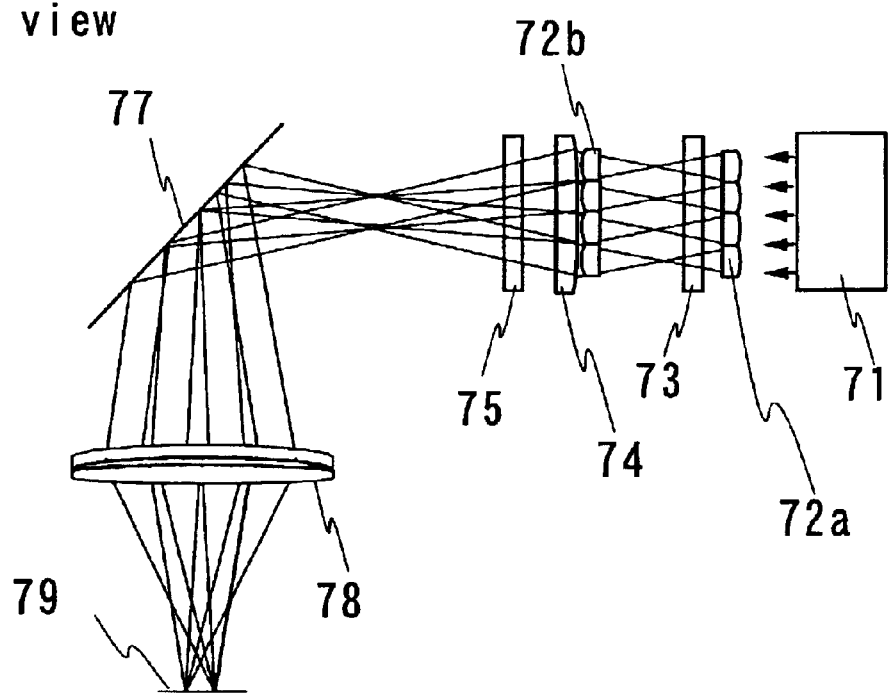
Fig. 10

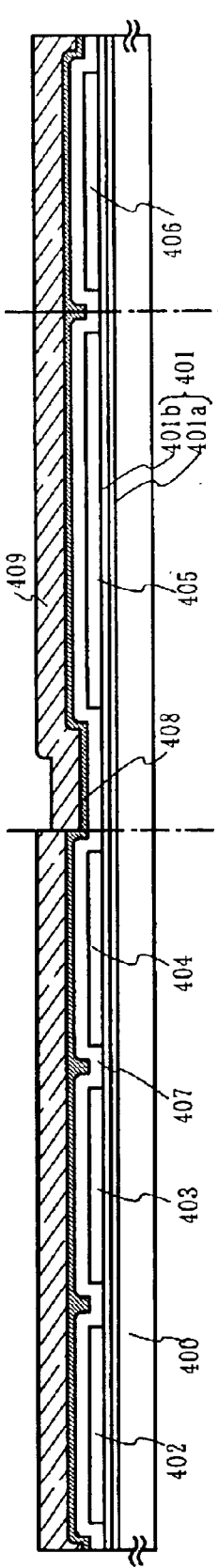
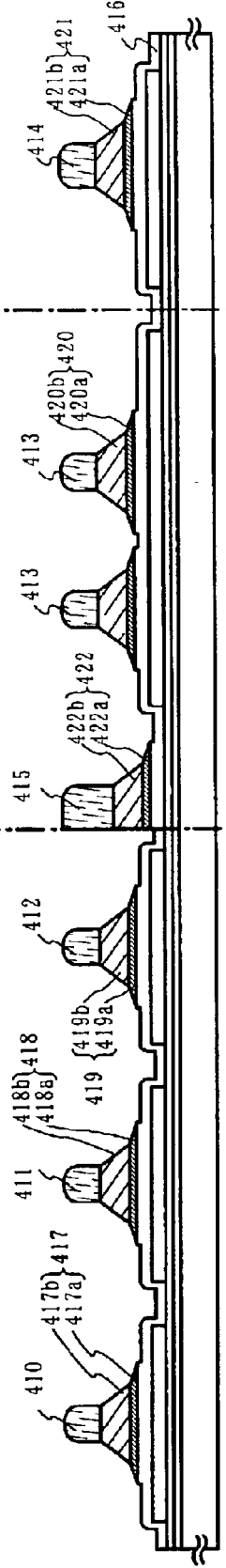
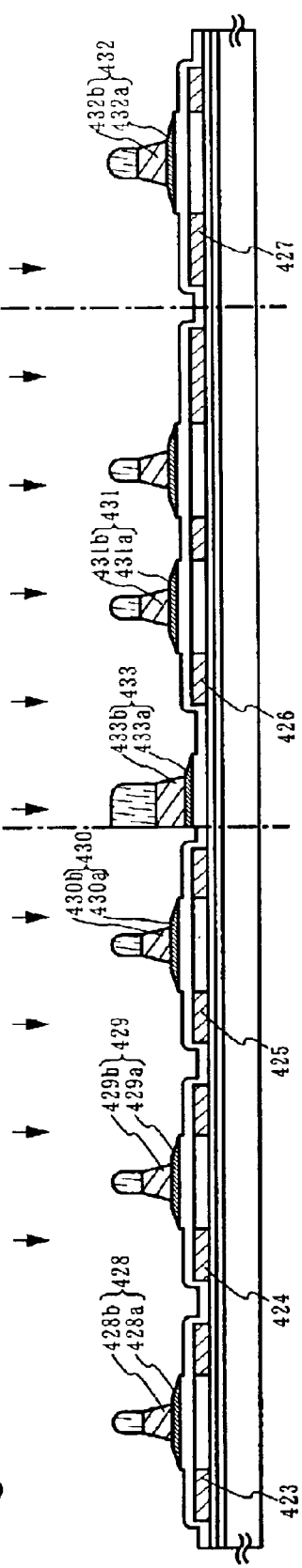
Fig. 12A
Fig. 12B
Fig. 12C

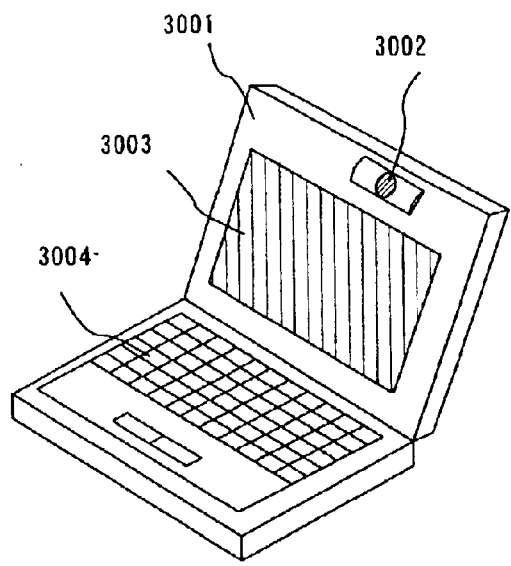
Fig.18A
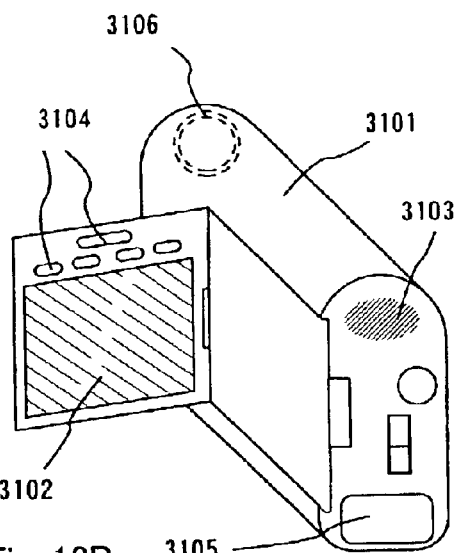
Fig. 18B
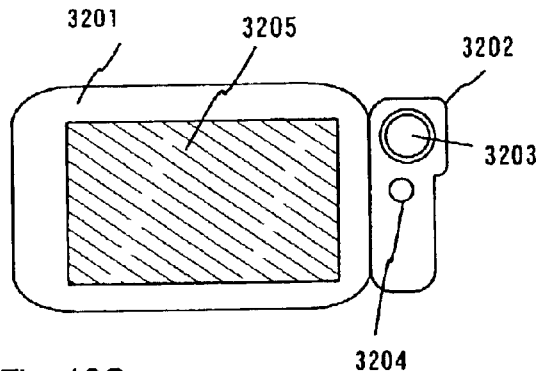
Fig. 18C
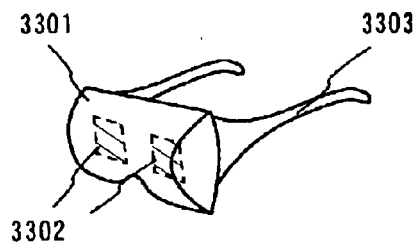
Fig.18D
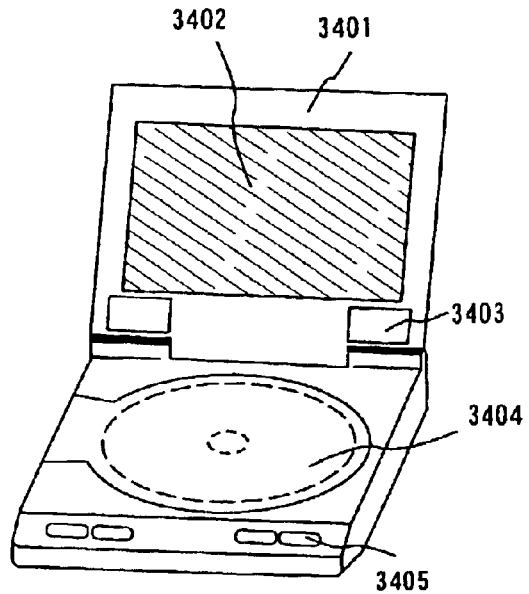
Fig.18 E
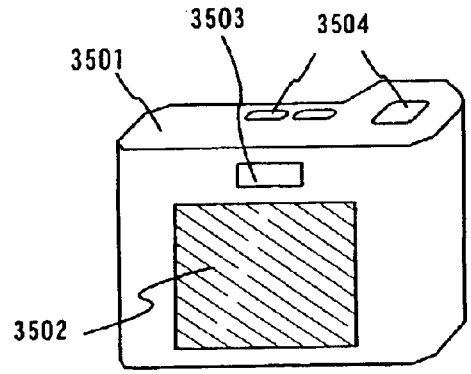
Fig.18.F

LASER IRRADIATION METHOD, LASER IRRADIATION APPARATUS, AND METHOD OF MANUFACTURING A SEMICONDUCTOR DEVICE

FIELD OF THE INVENTION

The present invention relates to a laser beam irradiation method and a laser irradiation apparatus for using the method (apparatus including a laser and an optical system for guiding laser beam emitted from the laser to an object to be irradiated). In addition, the present invention relates to a method of manufacturing a semiconductor device, which includes a laser beam irradiation step. Note that a semiconductor device described here includes an electro-optical device such as a liquid crystal display device or a light-emitting device and an electronic device that includes the electro-optical device as a part.

DESCRIPTION OF THE RELATED ART

In recent years, a wide study has been made on a technique in which laser annealing is performed for a semiconductor film formed on an insulating substrate made of glass or the like, to crystallize the film, to improve its crystallinity so that a crystalline semiconductor film is obtained, or to activate an impurity element. Note that a crystalline semiconductor film in this specification indicates a semiconductor film in which a crystallized region is present, and also includes a semiconductor film that is crystallized as a whole.

A method of forming pulse laser beam from an excimer laser or the like by an optical system such that it becomes a square shape or a linear shape on an irradiation surface, and scanning the laser beam (or relatively shifting an irradiation position of the laser beam with respect to the irradiation surface) to conduct annealing is superior in mass productivity and is excellent in technology. The "linear shape" described here means not a "line" in the strict sense but a rectangle (or a prolate ellipsoid shape) having a high aspect ratio. For example, it indicates a shape having an aspect ratio of 10 or more (preferably, 100 to 10000). Note that the linear shape is used to obtain an energy density required for sufficiently annealing an object to be irradiated. Thus, if sufficient annealing is conducted for the object to be irradiated, it may be either a rectangular shape or a planar. Presently, excimer lasers with 15 J/pulse come onto the market and there is a possibility to perform a laser anneal by a planar beam. Further, the spot of the laser light is made laser light's energy distribution on an irradiation surface of the laser light when there is not a special definition.

FIGS. 10A and 10B show an example of a configuration of an optical system for forming laser beam in a linear shape on an irradiation surface. This configuration is extremely general. All optical systems described above are based on the configuration shown in FIGS. 10A and 10B. According to the configuration, a cross sectional shape of laser beam is converted into a linear shape, and simultaneously an energy density distribution of laser beam on the irradiation surface is homogenized. In general, an optical system for homogenizing the energy density distribution of laser beam is called a beam homogenizer.

The spot of the laser beam emitted from a laser 71 is divided by a cylindrical lens array 73. The direction is called a first direction in this specification. It is assumed that, when a mirror is inserted in a course of an optical system, the above-mentioned first direction is changed in accordance with a direction of light bent by the above-mentioned mirror. In this configuration, the cylindrical lens array is divided into seven parts. Then, the laser beams are superposed on an irradiation surface 79 by a cylindrical lens 74, thereby homogenizing an energy density distribution of the linear laser beam in the longitudinal direction, and the length of the longitudinal direction is determined.

Next, the configuration shown in the side view of FIG. 10B will be described. The spot of the laser beam emitted from a laser 71 is divided by cylindrical lens arrays 72a and 72b. The direction is called a second direction in this specification. It is assumed that, when a mirror is inserted in a course of an optical system, the second direction is changed in accordance with a direction of light bent by the mirror. In this configuration, the cylindrical lens arrays 72a and 72b each are divided into four parts. The divided laser beams are temporarily synthesized by a cylindrical lens 74. After that, the laser beams are reflected by a mirror 77 and then condensed by a doublet cylindrical lens 78 so that they become again single laser beam on the irradiation surface 79. The doublet cylindrical lens 78 is a lens composed of two cylindrical lenses. Thus, an energy density distribution of the linear laser beam in a width direction is homogenized, thereby homogenizing an energy density distribution of the linear laser beam in the longitudinal direction, and the length of the width direction is determined.

For example, an excimer laser in which a size in a laser window is 10 mm×30 mm (which each are a half-width in beam profile) is used as the laser 71 and laser beam is produced by the optical system having the configuration shown in FIGS. 10A and 10B. Then, linear laser beam which has a uniform energy density distribution and a size of 125 mm×0.4 mm can be obtained on the irradiation surface 79.

At this time, when, for example, quartz is used for all base materials of the optical system, high transmittance is obtained. Note that coating is preferably conducted for the optical system such that transmittance of 99% or more is obtained at a frequency of the used excimer laser.

Then, the linear laser beam formed by the above configuration is irradiated with an overlap state while being gradually shifted in a width direction thereof. Thus, when laser annealing is performed for the entire surface of an amorphous semiconductor film, the amorphous semiconductor film can be crystallized, crystallinity can be improved to obtain a crystalline semiconductor film, or an impurity element can be activated.

At an edge of linear, rectangular, or sheet-like laser light formed on an irradiation surface or in the vicinity thereof by an optical system, the energy density is attenuated gradually due to aberration of a lens or the like (FIG. 11A). In this specification, a region at a laser light edge where the energy density is gradually attenuated is called an attenuation region.

As the substrate area is increased and the laser power is raised, it is now possible to form a longer linear beam or rectangular beam and a larger sheet-like beam. Annealing with such laser light is more efficient. However, the energy density of laser light emitted from a laser is smaller at its edge than around the center. Therefore, if laser light is expanded by an optical system more than prior art, attenuation in the attenuation region is intensified.

In the attenuation region, the energy density is lower than a region having a high uniformity in energy density and the low energy density is attenuated gradually. For that reason, an irradiation object cannot be annealed uniformly by laser light that has the attenuation region (FIG. 11B). Even when the laser light scans an irradiation object for annealing in a manner that makes the attenuation regions overlap each other, it still is impossible to anneal the irradiation object uniformly because annealing conditions of the attenuation region are entirely different from annealing conditions of the highly uniform region. Accordingly, a region annealed by the attenuation region of laser light and a region annealed by the highly uniform region of the laser light cannot be treated equally.

For example, when a semiconductor film is an irradiation object, a region of the semiconductor film that is annealed by the attenuation region and a region of the semiconductor film that is annealed by the highly uniform region have different crystallinity. Therefore, if this semiconductor film varied in crystallinity from one region to another is used to manufacture TFTs, the electric characteristic of a TFT formed from the region that is annealed by the attenuation region is inferior to other TFTs and causes fluctuation among the TFTs on the same substrate.

As shown in FIG. 10, a complicate optical system is needed to form a linear beam. Optical adjustment for an optical system as such is very difficult to perform and, in addition, the apparatus has to be large in size because of large footprint.

If laser light used has high reflectance against an irradiation object and the laser light enters the irradiation object perpendicular to the object, the light goes back the light path it used upon entering the irradiation object (return light). Return light affects laser apparatus by changing the laser output and frequency and by breaking a rod.

SUMMARY OF THE INVENTION

The present invention has been made in view of the above, and an object of the present invention is therefore to provide laser irradiation apparatus which uses a simpler optical system than prior art to form a rectangular beam with the attenuation region at a laser light edge reduced for efficient annealing. Another object of the present invention is to provide a laser irradiation method using this laser irradiation apparatus as well as a method of manufacturing a semiconductor device which includes the laser irradiation method in its process.

The present invention is characterized in that laser beams emitted from a plurality of lasers are each divided and that laser beams emitted from different lasers and having different energy distributions are synthesized to form laser light having excellent uniformity in energy distribution. Here, energy distributions which are not identical but become the same distribution by rotation are deemed as different energy distributions. Also, the present invention is characterized in that laser beams emitted from a plurality of lasers are each divided, and that a laser beam including at least one laser beam that is emitted from a different laser and is in a different positional relation is synthesized with another such laser beam to form laser light having excellent uniformity in energy distribution.

Also, the present invention is characterized in that laser beams emitted from a plurality of lasers are each divided, and that laser beams emitted from different lasers and having different energy distributions enter a convex lens at an angle, exit the convex lens, and are synthesized on an irradiation surface or in the vicinity thereof to form rectangular laser light having excellent uniformity in energy distribution.

Even when laser beams emitted from different lasers are overlapped, they do not interfere each other. Accordingly the present invention is effective especially for laser light irradiation that uses highly interferential lasers such as a YVO$_4$ laser having a coherent length of several tens to several hundreds m and a YAG laser having a coherent length of 1 cm or more.

By making laser light enter a convex lens at an angle, astigmatism or other aberration is caused to shape laser light into a linear shape on an irradiation surface or in the vicinity thereof.

When a divided laser beam is overlapped with another divided laser beam, it is preferred to overlap laser beams having different energy distributions from one another. This is because overlapping a large number of laser beams that have different energy distributions produces uniform laser light.

A structure of the present invention disclosed in this specification is laser irradiation apparatus characterized by comprising: a plurality of lasers; means for dividing each of plural first laser beams emitted from the plural lasers into plural second laser beams; and means for choosing one laser beam out of the second laser beams for each of the plural first laser beams and synthesizing the chosen second laser beams in the same region on an irradiation surface or in the vicinity thereof.

In the above structure, the laser irradiation apparatus is characterized in that the lasers are continuous wave or pulse oscillation solid-state lasers or gas lasers or metal lasers. Examples of the solid-state lasers include a continuous wave or pulse oscillation YAG laser, YVO$_4$ laser, YLF laser, YAlO$_3$ laser, Y$_2$O$_3$ laser, glass laser, ruby laser, alexandrite laser, and Ti:sapphire laser. Examples of the gas lasers include a continuous wave or pulse oscillation excimer laser, Ar laser, Kr laser, and CO$_2$ laser. Examples of the metal lasers include a continuous wave or pulse oscillation helium cadmium laser, copper steam laser, and gold steam laser.

In the above structure, the laser light is desirably converted into harmonic by a non-linear optical element. For example, a YAG laser is known to output laser light having a wavelength of 1065 nm as the fundamental wave. This laser light is absorbed by a silicon film at a very low absorption coefficient and it is technically very difficult to crystallize an amorphous silicon film, one of semiconductor films, with this laser light. However, this laser light can be converted into a shorter wavelength by a non-linear optical element. Examples of harmonic thereof include the second harmonic (532 nm), the third harmonic (355 nm), the fourth harmonic (266 nm), and the fifth harmonic (213 nm). These harmonics are absorbed in an amorphous silicon film at a high absorption coefficient and therefore can be used in crystallization of an amorphous silicon film.

In the above structure, the laser irradiation apparatus is characterized in that the dividing means is one or more kinds selected from a slit, a mirror, a prism, a cylindrical lens, and a cylindrical lens array.

In the above structure, the laser irradiation apparatus is characterized in that the synthesizing means is one or more kinds selected from a mirror and a cylindrical lens.

A structure of the present invention disclosed in this specification is a method of laser irradiation, characterized by comprising: dividing each of plural first laser beams that are emitted from a plurality of lasers into plural second laser beams; choosing one laser beam out of the second laser beams for each of the plural first laser beams and synthesizing the laser beams in the same region on an irradiation surface or in the vicinity thereof.

In the above structure, the laser irradiation apparatus is characterized in that the lasers are continuous wave or pulse oscillation solid-state lasers or gas lasers or metal lasers. Examples of the solid-state lasers include a continuous wave or pulse oscillation YAG laser, YVO$_4$ laser, YLF laser, YAlO$_3$ laser, Y$_2$O$_3$ laser, glass laser, ruby laser, alexandrite laser, and Ti:sapphire laser. Examples of the gas lasers include a continuous wave or pulse oscillation excimer laser, Ar laser, Kr laser, and CO$_2$ laser. Examples of the metal lasers include a continuous wave or pulse oscillation helium cadmium laser, copper steam laser, and gold steam laser.

In the above structure, the laser light is desirably converted into harmonic by a non-linear optical element.

A structure of the present invention disclosed in this specification is a method of manufacturing a semiconductor device, characterized by comprising: dividing each of plural first laser beams that are emitted from a plurality of lasers into plural second laser beams; choosing one laser beam out of the second laser beams for each of the plural first laser beams to obtain third laser beams and synthesizing the third laser beams in the same region on an irradiation surface or in the vicinity thereof to form a fourth laser beam; and irradiating a semiconductor film with the fourth laser beam while moving the laser beam relative to the semiconductor film.

In the above structure, the laser irradiation apparatus is characterized in that the lasers are continuous wave or pulse oscillation solid-state lasers or gas lasers or metal lasers. Examples of the solid-state lasers include a continuous wave or pulse oscillation YAG laser, YVO$_4$ laser, YLF laser, YAlO$_3$ laser, Y$_2$O$_3$ laser, glass laser, ruby laser, alexandrite laser, and Ti:sapphire laser. Examples of the gas lasers include a continuous wave or pulse oscillation excimer laser, Ar laser, Kr laser, and CO$_2$ laser. Examples of the metal lasers include a continuous wave or pulse oscillation helium cadmium laser, copper steam laser, and gold steam laser.

In the above structure, the laser light is desirably converted into harmonic by a non-linear optical element.

In the above structure, the semiconductor film is desirably a film containing silicon. A glass substrate, a quartz substrate, a silicon substrate, a plastic substrate, a metal substrate, a stainless steel substrate, a flexible substrate, etc. can be used as a substrate on which the semiconductor film is formed. Examples of the glass substrate include a barium borosilicate glass substrate and an aluminoborosilicate glass substrate. A flexible substrate means a substrate in the form of a PET, PES, PEN, or acrylic film or other similar film. When a flexible substrate is used to manufacture a semiconductor device, the device can have a reduced weight. It is desirable to form on the front side, or on the front side and back side, of a flexible substrate a single layer or multi-layer of aluminum films (AlON, AlN, AlO, or the like), carbon films (DLC (diamond-like carbon) or the like), or SiN films as a barrier layer because the barrier layer improves the durability and other properties.

The present invention synthesizes laser beams emitted from different lasers on an irradiation surface or in the vicinity thereof and therefore interference does not take place. Most desirably, laser beams having different energy distributions from one another are synthesized on an irradiation surface or in the vicinity thereof. However, since the optimum synthesizing method varies from one laser light mode to another, the synthesizing method used can be chosen to suit individual cases. For example, laser light in the TEM$_{oo}$ mode is highly symmetrical and therefore laser light having a relatively high uniformity can be obtained by dividing laser light into two and synthesizing the left half and right half thereof. Needless to say, more highly uniform laser light is obtained when the number of division is larger. Laser light in other modes can also provide highly uniform laser light using the same method.

The present invention can irradiate a semiconductor film formed on a substrate with a rectangular beam having highly uniform energy distribution. Accordingly, a semiconductor film of uniform physical property can be obtained. This makes it possible to reduce fluctuation in electric characteristic of TFTs manufactured from this semiconductor film. This also improves the operation characteristic and reliability of a semiconductor device manufactured from these TFTs.

BRIEF DESCRIPTION OF THE DRAWINGS

In the accompanying drawings:

FIG. 10 is a diagram showing an example of a conventional optical system;

FIGS. 12A to 12C are sectional views showing a process of manufacturing a pixel TFT and TFTs of a driving circuit;

FIGS. 18A to 18F are diagrams showing examples of a semiconductor device;

DETAILED DESCRIPTION OF THE PREFERRED EMBODIMENTS

Embodiment Mode 1

Figure 1:
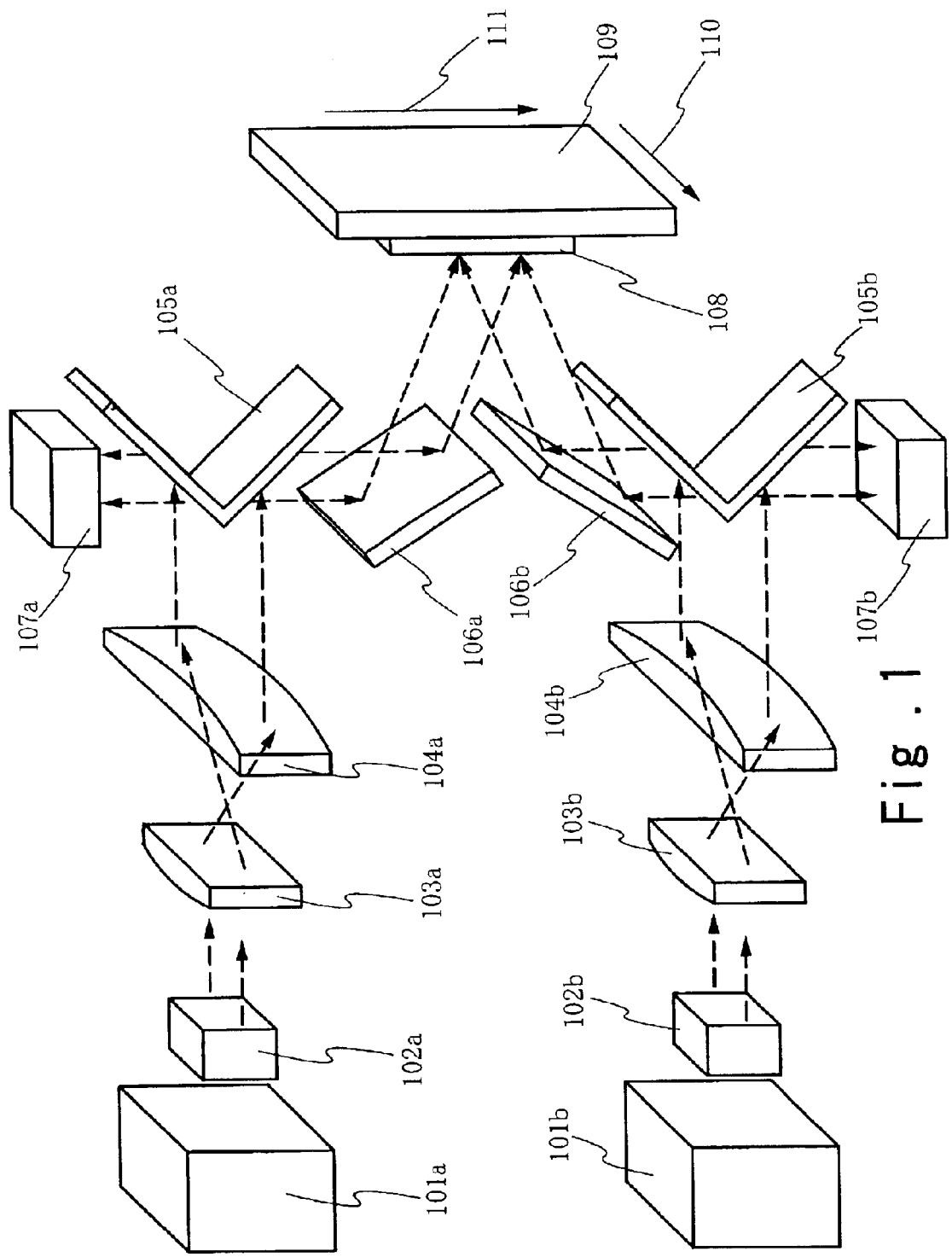
FIG. 1 is a diagram showing an example of an optical system of the present invention.

This embodiment mode describes with reference to FIG. 1 and FIGS. 2A to 2C an example of optical system for dividing laser beams that are emitted from a plurality of lasers and overlapping laser beams that have different energy distributions from one another.

A laser 101a and a laser 101b each emit laser light. The lasers 101a and 101b used here are continuous wave or pulse oscillation solid-state lasers, gas lasers, or metal lasers. Examples of the solid-state lasers include a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser. Examples of the gas lasers include a continuous wave or pulse oscillation excimer laser, Ar laser, Kr laser, and $CO_2$ laser. Examples of the metal lasers include a continuous wave or pulse oscillation helium cadmium laser, copper steam laser, and gold steam laser. The laser light emitted from the lasers 101a and 101b may be converted into harmonic by a non-linear optical element.

Denoted by 102a and 102b are isolators. If laser light used has high reflectance against an irradiation object and the laser light enters the irradiation object perpendicular to the object, the light goes back the light path it used upon entering the irradiation object (return light). Return light affects laser apparatus by changing the laser output and frequency and by breaking a rod. Components of the optical system in this embodiment mode are arranged symmetrically and therefore reflected light of the two lasers on the irradiation surface may mutually affect the other laser in a way similar to return light. This is why installing the isolators 102a and 102b is desirable.

Each of the laser light emitted is expanded by beam expanders 103a and 104a, or 103b and 104b. Beam expanders are effective especially when laser light emitted from a laser has a small shape, and may be omitted depending on the size of laser light. The laser light may be expanded not only in one direction but also in two directions. The cylindrical lenses 103a, 104a, 103b, and 104b are desirably made of synthetic silica glass because it gives them high transmittance. Coating on the surfaces of the cylindrical lenses 103a and 104a, or 103b and 104b is desirably capable of providing 99% or higher transmittance for the wavelength of laser light used.

Figure 2A:
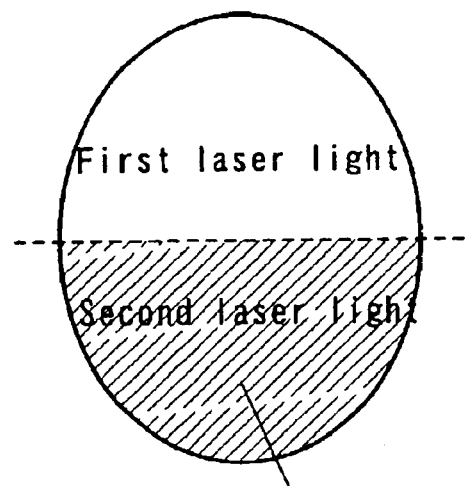
FIGS. 2A to 2C are diagrams showing an example of laser light being divided by the optical system of FIG. 1.
Figure 2B:
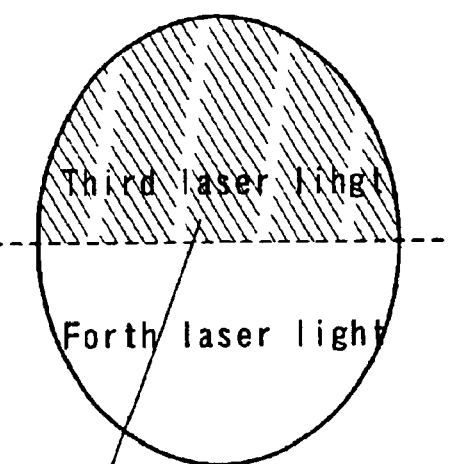

The laser light that exits the beam expanders 103a and 104a or 103b and 104b is divided in two directions by a mirror 105a or 105b. The mirror 105a or 105b dividing the laser light is described referring to FIGS. 2A and 2B. FIGS. 2A and 2B show laser light shapes in section perpendicular to the direction the laser light travels. Laser light emitted from the laser 101a is divided into first laser light and second laser light by the mirror 105a as shown in FIG. 2A. The second laser light enters an irradiation object 108 whereas the first laser light is absorbed by a damper 107a. On the other hand, laser light emitted from the laser 101b is divided into third laser light and fourth laser light by the mirror 105b as shown in FIG. 2B. The third laser light enters the irradiation object 108 whereas the fourth laser light is absorbed in a damper 107b.

Figure 2C:
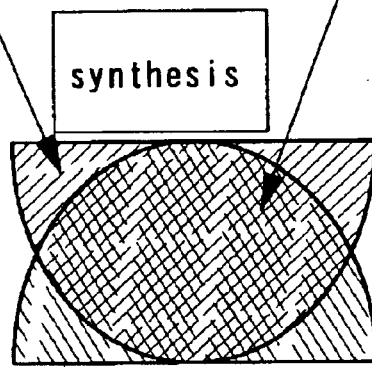
Figure 3:
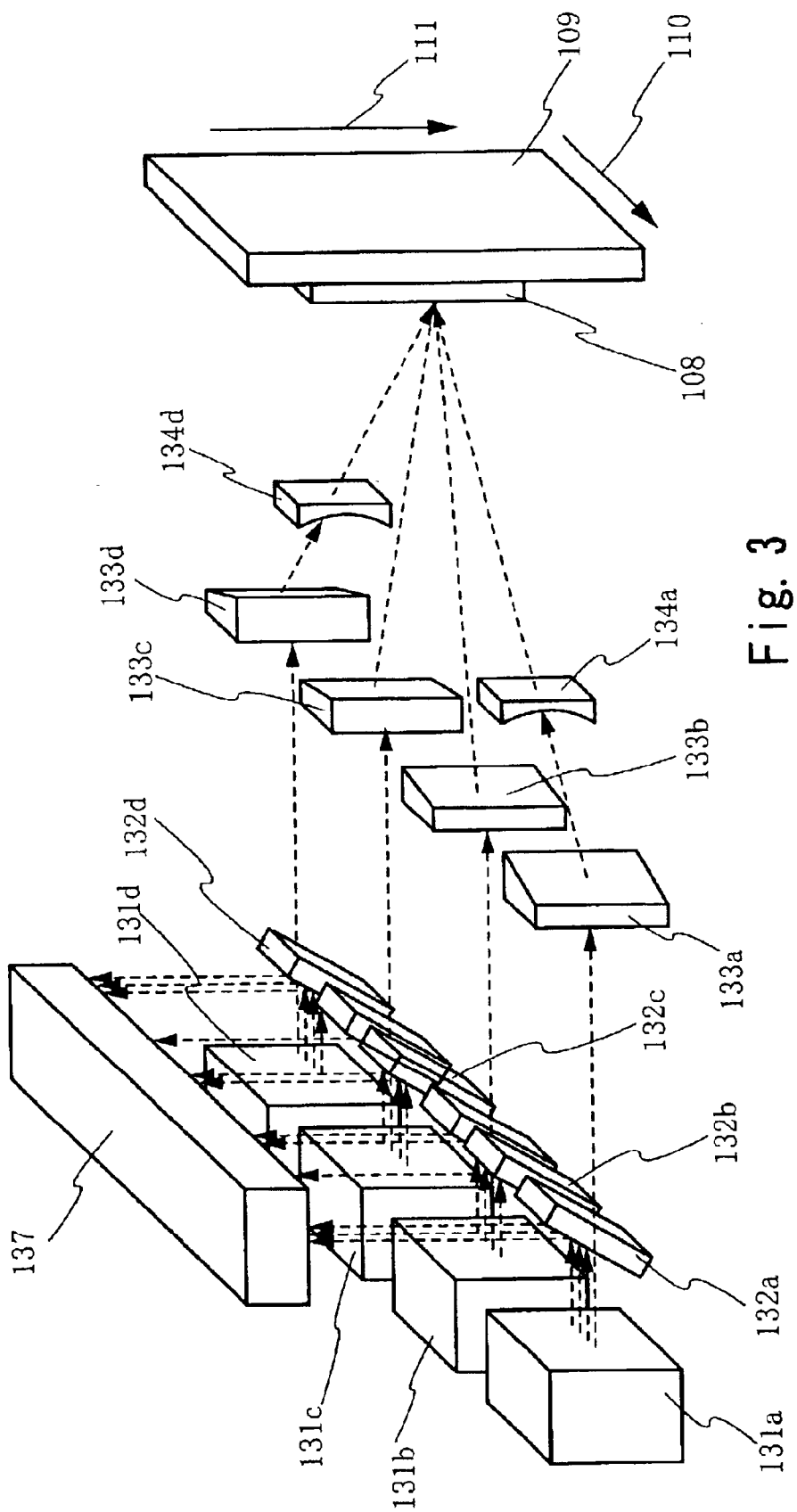
FIG. 3 is a diagram showing an example of an optical system of the present invention.

The two laser beams entering the irradiation object 108 do not interfere each other even when synthesized because they are emitted from different lasers. Since the second laser light of laser light emitted from the laser 101a enters the irradiation object and the third laser light of laser light emitted from the laser 101b enters the irradiation object, laser beams having different energy distributions are synthesized on the irradiation surface or in the vicinity thereof. As a result, rectangular laser light having excellent uniformity in energy distribution is formed. (FIG. 2C)

The irradiation object 108 is irradiated with the thus formed laser light while moving the laser light relative to the irradiation object 108 in the direction indicated by 110 or 111, for example. This way a desired region of the irradiation object 108, or the entire region thereof can be irradiated.

If this laser irradiation apparatus is used to anneal a semiconductor film, the semiconductor film can be crystallized, the crystallinity is improved to obtain a crystalline semiconductor film, and an impurity element can be activated.

In this embodiment mode, laser light is divided by a mirror but the present invention is not limited thereto. A slit, a prism, a cylindrical lens, or a cylindrical lens array may be employed instead.

Although this embodiment mode uses two lasers and each laser light is divided in two, the present invention is not limited thereto. Preferably ten or so lasers are used. When using a small number of lasers, it is desirable to set the number of lasers to an even number and divide each laser light in an even number. Not all of lasers used may be identical.

In this embodiment mode, laser light is divided into equal widths by a plane perpendicular to the direction the laser light travels as shown in FIGS. 2A to 2C. However, the present invention is not limited thereto.

In this embodiment mode, laser beams having different energy distributions from one another are synthesized on an irradiation surface or in the vicinity thereof. However, since the optimum synthesizing method varies from one laser light mode to another, the synthesizing method used can be chosen to suit individual cases. For example, laser light in the $TEM_{oo}$ mode is highly symmetrical and therefore laser light having a relatively high uniformity can be obtained by dividing laser light into two and synthesizing the left half and right half thereof. Needless to say, more highly uniform laser light is obtained when the number of division is larger. Laser light in other modes can also provide highly uniform laser light using the same method.

If the coating on the surface of synthesized silica glass is changed to suite the wavelength of laser light used, the present invention can be applied to various lasers.

Although a rectangular beam is formed in this embodiment mode so that laser light has a rectangular shape on an irradiation surface, the laser light shape formed is not limited thereto. The laser light shape emitted from a laser is varied from one type of laser to another type and, even when shaped by an optical system, the resultant shape tends to be influenced by the initial shape. For example, the laser light shape emitted from a XeCl excimer laser may be a 10 mm×30 mm (both are half-width in beam profile) rectangle, and laser light emitted from a solid-state laser has a circular shape if the rod shape is cylindrical and a rectangular shape if the rod shape is slab-like. The present invention can be applied to laser light of any shape without a problem as long as the laser light has an energy density sufficient for annealing of an irradiation object.

Embodiment Mode 2

Figure 21:
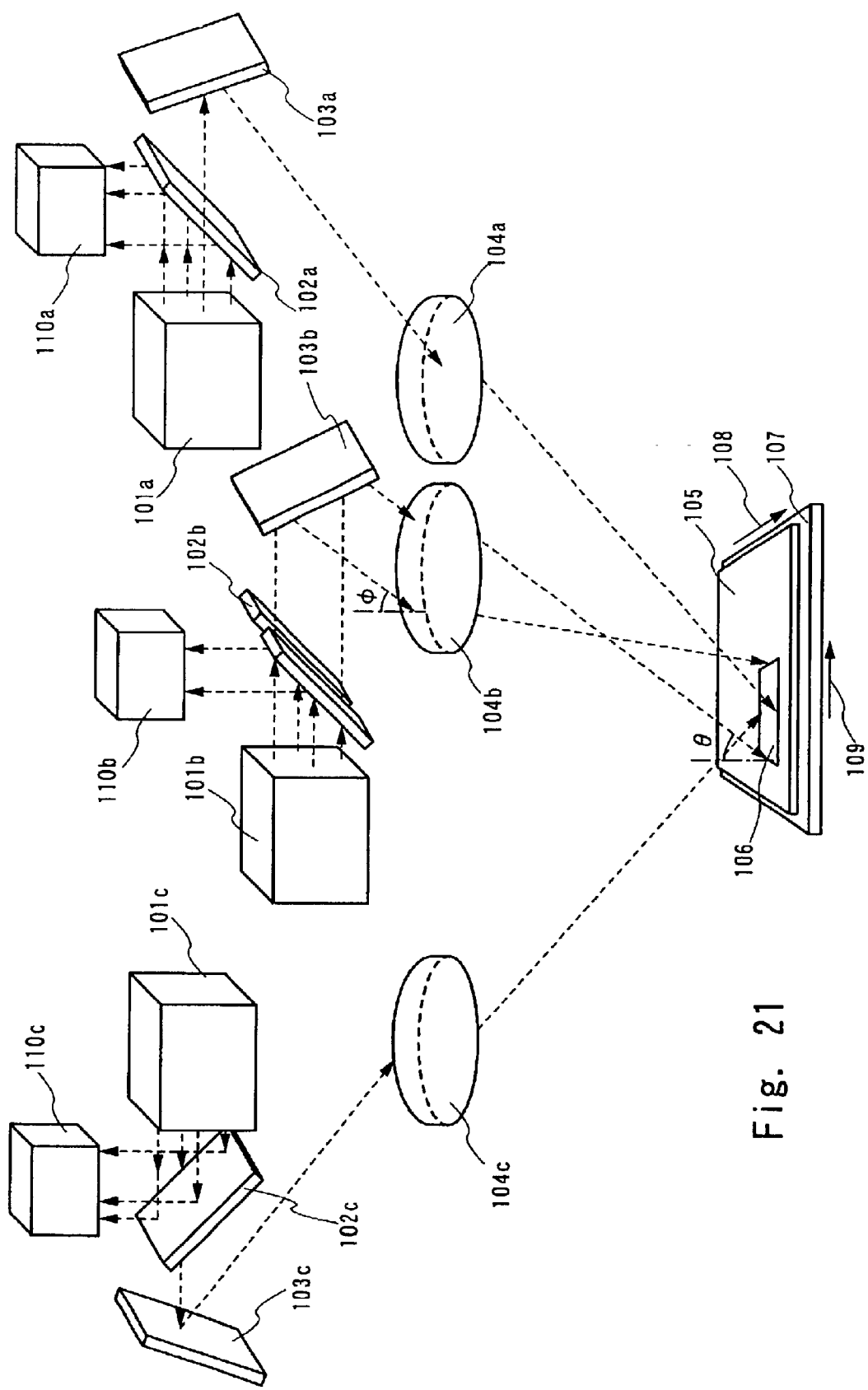
FIG. 21 is a diagram showing an example of an optical system of the present invention.
Figure 22:
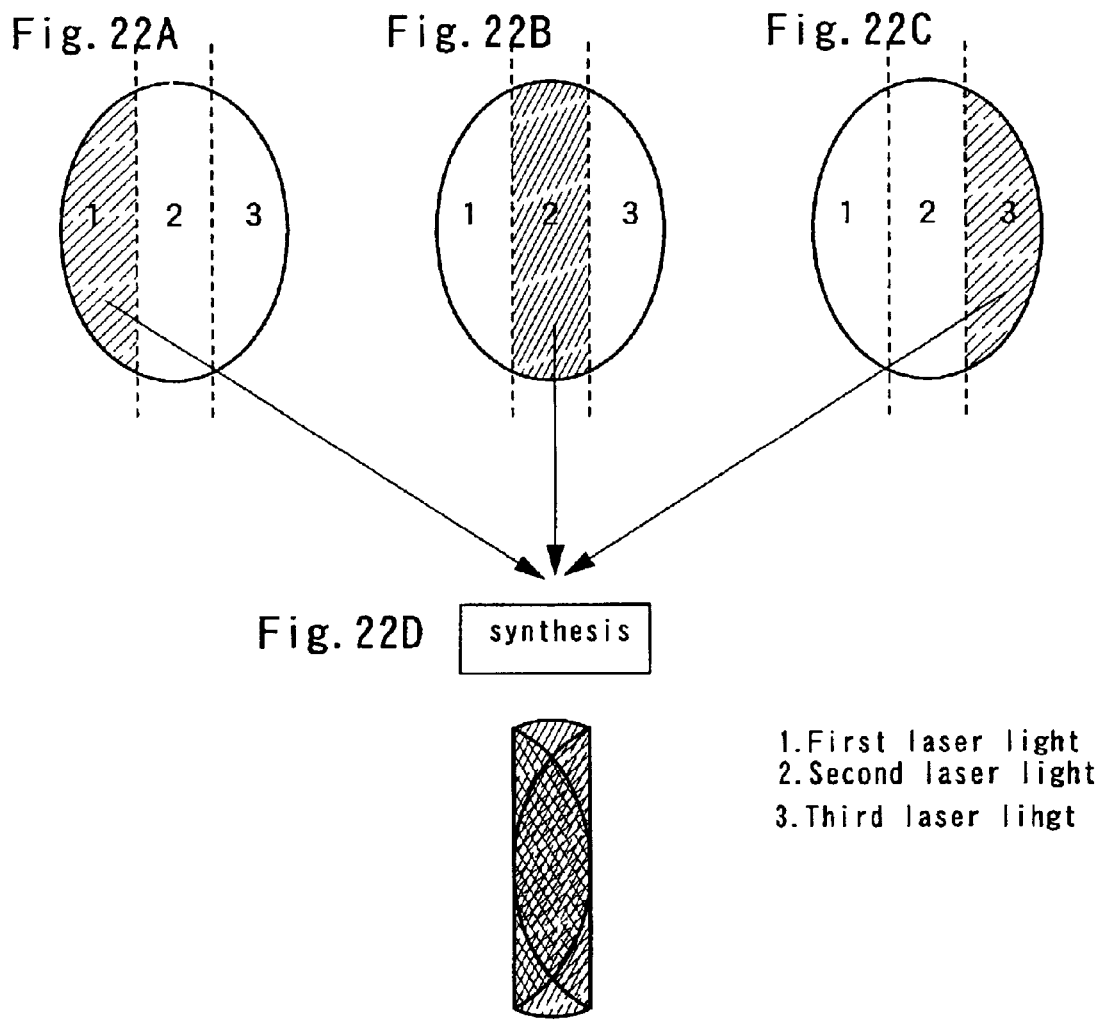
FIGS. 22A to 22D are diagrams showing an example of laser light being divided by the optical system of FIG. 21.
Figure 23:
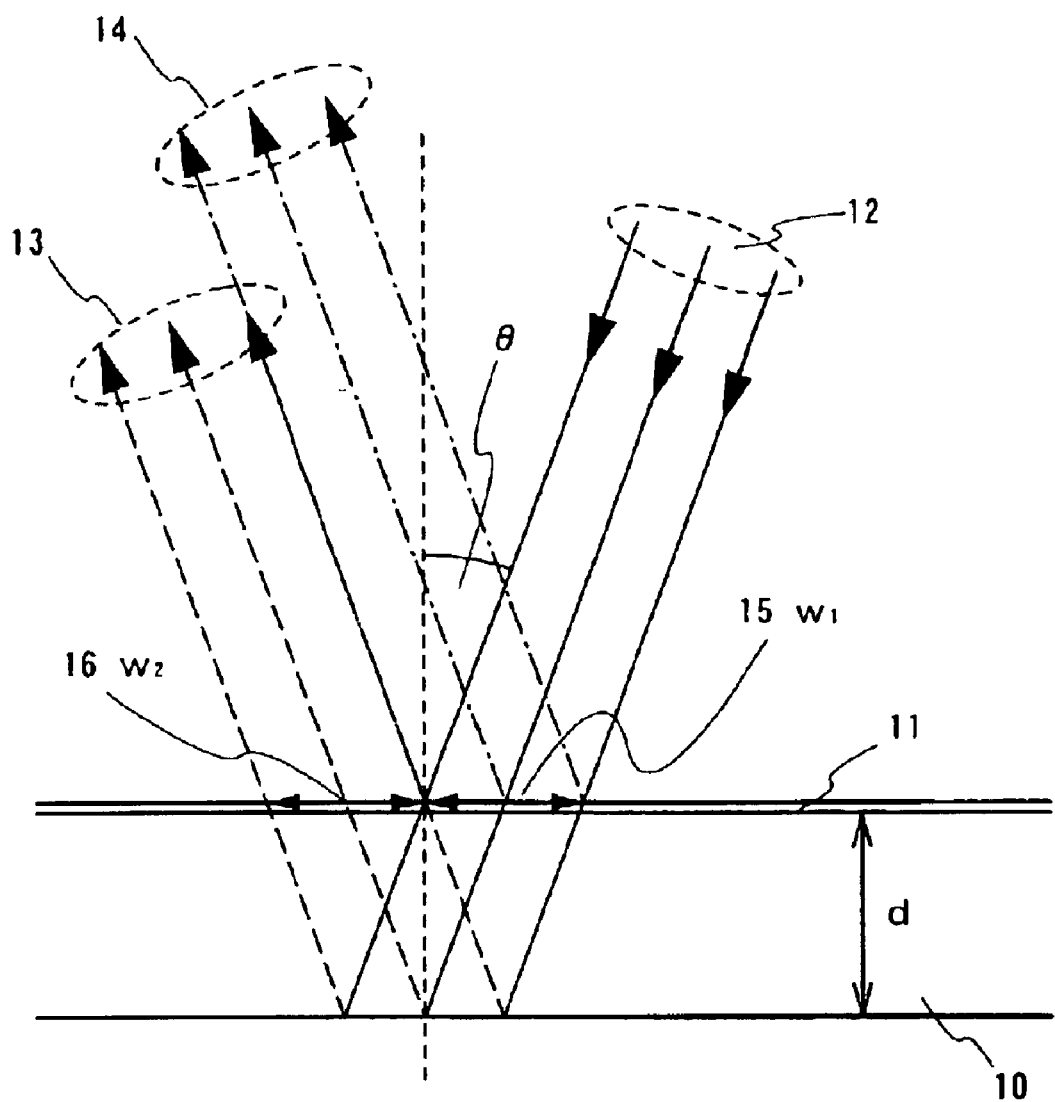
FIG. 23 is a diagram for obtaining an incident angle θ of laser light entering an irradiation object.
Figure 24:
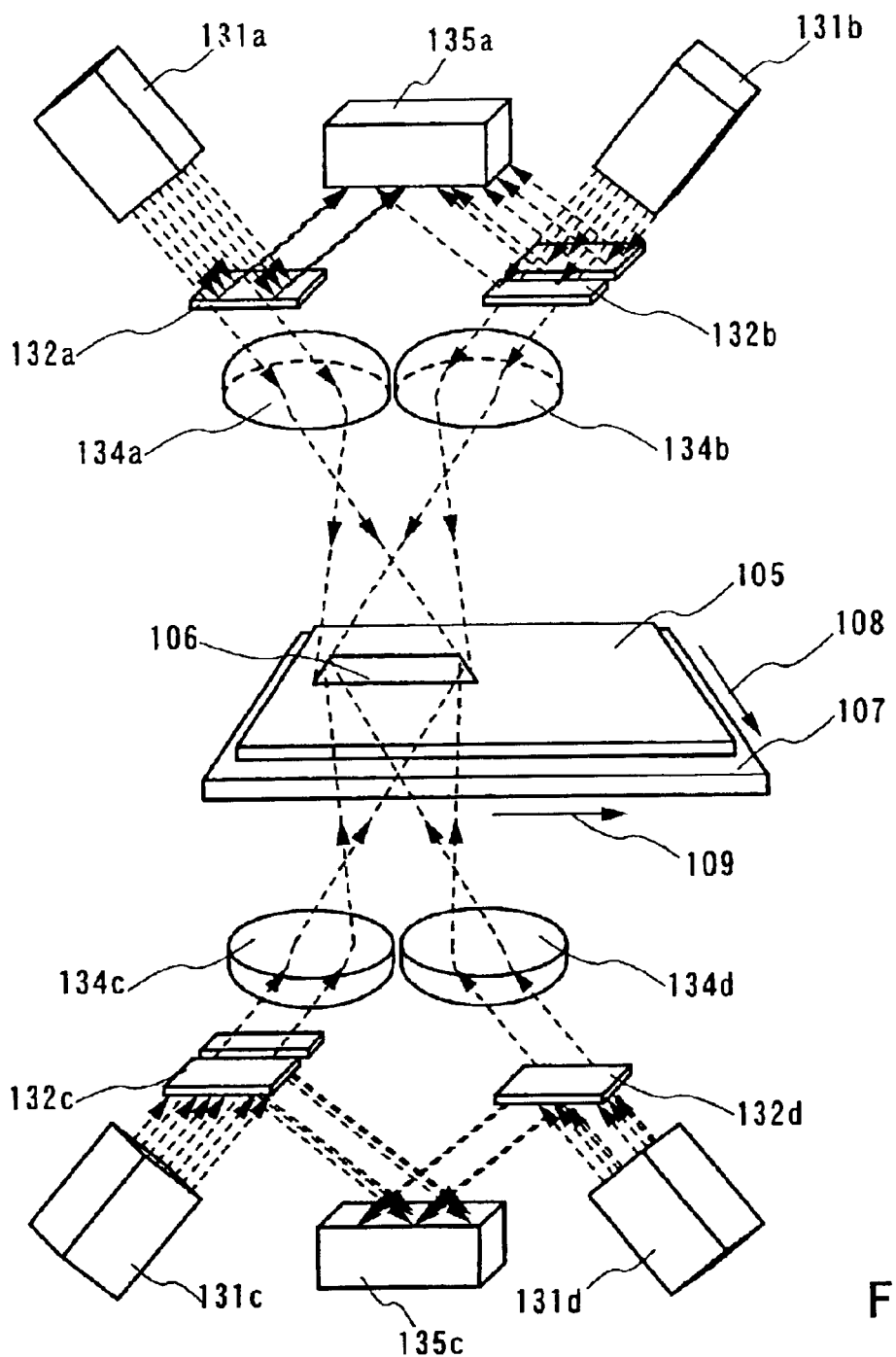
FIG. 24 is a diagram showing an example of an optical system of the present invention.

This embodiment mode describes with reference to FIGS. 21 to 23 an example of optical system for dividing laser beams that are emitted from three of lasers and overlapping laser beams that have different energy distributions from one another.

Lasers 101a to 101c each emit laser light. The lasers 101a to 101c used here are continuous wave or pulse oscillation solid-state lasers, gas lasers, or metal lasers. Examples of the solid-state lasers include a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser. Examples of the gas lasers include a continuous wave or pulse oscillation excimer laser, Ar laser, Kr laser, and $CO_2$ laser. Examples of the metal lasers include a continuous wave or pulse oscillation helium cadmium laser, copper steam laser, and gold steam laser. The laser light emitted from the lasers 101a to 101c may be converted into harmonic by a non-linear optical element.

Though not shown, laser beams emitted from the lasers 101a to 101c separately may be expanded by beam expanders. Beam expanders are effective especially when laser light emitted from a laser has a small shape.

Laser beams emitted from the lasers 101a to 101c are divided by optical systems 102a to 102c, respectively, in two directions. Each of the optical systems 102a to 102c is a combination of a mirror and a cylindrical lens. The optical systems 102a to 102c dividing the laser light are shown in FIGS. 22A to 22D. Laser light emitted from the laser 101a is divided into three by the optical system 102a and only the left hand laser light of the three (first laser light in FIG. 22A) travels straight whereas the other two are reflected by the mirror and reach a damper 110a. Laser light emitted from the laser 101b is divided into three by the optical system 102b and only the center laser light of the three (second laser light in FIG. 22B) travels straight whereas the other two are reflected by the mirror and reach a damper 110b. Laser light emitted from the laser 101c is divided into three by the optical system 102c and only the right hand laser light of the three (third laser light in FIG. 22C) travels straight whereas the other two are reflected by the mirror and reach a damper 110c. In this way the optical systems 102a to 102c determine which laser light travels straight and which laser light is reflected.

Alternatively, each laser light may enter a cylindrical lens array to be divided and then only a desired one out of divided laser beams may be taken out using a slit that has a reflective surface.

The laser beams traveling straight through the optical systems 102a to 102c respectively pass through mirrors 103a to 103c and enter convex lenses 104a to 104c at angles. This causes aberration such as astigmatism to shift the focal point and make it possible to form a rectangular beam 106 on an irradiation surface or in the vicinity thereof. As shown in FIGS. 22A to 22D, laser beams that have passed through the optical systems 102a and 102c are longitudinally shorter than a laser beam that has passed the optical system 102b. Therefore laser beams that have passed through the optical systems 102a and 102c are more slanted than a laser beam that has passed the optical system 102b when the beams enter the lenses. This makes them longer in the longitudinal direction so that the three laser beams have the same length in the longitudinal direction. Alternatively, the shorter two laser beams may be expanded by a cylindrical lens or the like.

Coating on the surfaces of the convex lenses 104a to 104c is desirably capable of providing 99% or higher transmittance for the wavelength of laser light used. Furthermore, it is desirable to use as the convex lenses aspherical lenses in which spherical aberration is corrected. With the use of aspherical lenses, light collection is improved as well as the aspect ratio and energy density distribution.

The laser beams that have passed through the convex lenses 104a to 104c are synthesized on an irradiation surface or in the vicinity thereof to form a rectangular beam 106 (FIG. 22D). The thus formed rectangular beam does not interfere since laser beams used to form the beam 106 are emitted from different lasers. In addition, the rectangular beam has excellent uniformity in energy distribution because plural laser beams having different energy distributions are synthesized on an irradiation surface or in the vicinity thereof.

An irradiation object 105 is irradiated with the thus formed rectangular beam while moving the beam relative to the irradiation object 105 in the direction indicated by 108 or 109, for example. This way a desired region of the irradiation object 105, or the entire region thereof can be irradiated.

However, depending on the wavelength of laser light, light reflected by the surface of the irradiation object 105 may interfere with light reflected by the back side of a substrate on which the irradiation object 105 is formed. FIG. 23 shows an example in which a semiconductor film 11 is formed as the irradiation object 105 on a substrate 10. If light reflected by the semiconductor film 11 and light reflected by the back side of the substrate 10 do not overlap each other, interference of the reflected light does not take place.

In this case, when an incident face is defined as a plane which is perpendicular to the irradiation surface and which includes a shorter side or longer side of the rectangle shape of the long beam, an incident angle θ of the laser light desirably satisfies θ≧arctan(W/2d), wherein the length of the shorter side or longer side included in the incident face is given as W and the thickness of a substrate transmissive of the laser light is given as d. The symbol W in the expression satisfies $W=(w_1+w_2)/2$ when $w_1$ represents a beam length 15 upon entering the irradiation object and $w_2$ represents the length of the beam reflected by the back side of the substrate 10. If the laser light track is not on the incident face, the track is projected onto the incident face and the incident angle thereof is set as θ. When laser light enters the incident face at this incident angle θ, light reflected by the front side of the substrate and light reflected by the back side of the substrate do not interfere each other and uniform laser light irradiation can be obtained. If the incident angle θ with respect to the irradiation object is set to Brewster angle, the reflectance is reduced to the lowest level and therefore laser light can be used efficiently. The above discussion is on the premise that the refractive index of the substrate is 1. In practice, the refractive index of most substrates is around 1.5 and, if the calculation is based on this value, the angle obtained is larger than the one calculated in the above discussion. However, the energy of a linear beam is attenuated at both edges in the longitudinal direction to lessen the influence of interference at the edges and therefore a satisfactory level of interference attenuation effect is obtained at the calculated value of the above discussion. Desirably, the incident angle of every laser light that enters the irradiation surface satisfies the above expression, θ≧arctan(W/2d).

A reflection preventive film may be formed on the surface of an irradiation object.

If this laser irradiation apparatus is used to anneal a semiconductor film, the semiconductor film can be crystallized, the crystallinity is improved to obtain a crystalline semiconductor film, and an impurity element can be activated.

Although this embodiment mode uses three lasers and each laser light is divided in three, the present invention is not limited thereto.

In this embodiment mode, laser light is divided into equal widths by a plane perpendicular to the direction the laser light travels as shown in FIG. 22. However, the present invention is not limited thereto.

The laser light shape emitted from a laser is varied from one type of laser to another type and, even when shaped by an optical system, the resultant shape tends to be influenced by the initial shape. For example, the laser light shape emitted from a XeCl excimer laser is rectangular, and laser light emitted from a solid-state laser has a circular shape if the rod shape is cylindrical and a rectangular shape if the rod shape is slab-like. The present invention can be applied to laser light of any shape.

More detailed description will be given on the present invention structured as above using the following embodiments.

Embodiment 1

This embodiment describes with reference to FIG. 3 and FIGS. 4A to 4E an example of optical system for dividing laser beams that are emitted from four lasers and overlapping laser beams that have different energy distributions from one another.

Lasers 131a to 131d each emit laser light. The lasers 131a to 131d used here are continuous wave or pulse oscillation solid-state lasers, gas lasers, or metal lasers. Examples of the solid-state lasers include a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser. Examples of the gas lasers include a continuous wave or pulse oscillation excimer laser, Ar laser, Kr laser, and $CO_2$ laser. Examples of the metal lasers include a continuous wave or pulse oscillation helium cadmium laser, copper steam laser, and gold steam laser. The laser light emitted from the lasers 131a to 131d may be converted into harmonic by a non-linear optical element.

In this embodiment, a continuous wave $YVO_4$ laser is used and its laser light is converted into the second harmonic by a non-linear optical element. The beam diameter of the laser light is 2.25 mm and the beam spread angle is set to 0.35 mrad.

Though not shown in the drawing, it is desirable to install isolators. This is because components of the optical system in this embodiment are arranged symmetrically and therefore reflected light of lasers on an irradiation surface may mutually affect other lasers in a way similar to return light.

Beam expanders (not shown) may be provided to expand laser light in the longitudinal direction and lateral direction. Beam expanders are effective especially when laser light emitted from a laser has a small shape.

Figure 4:
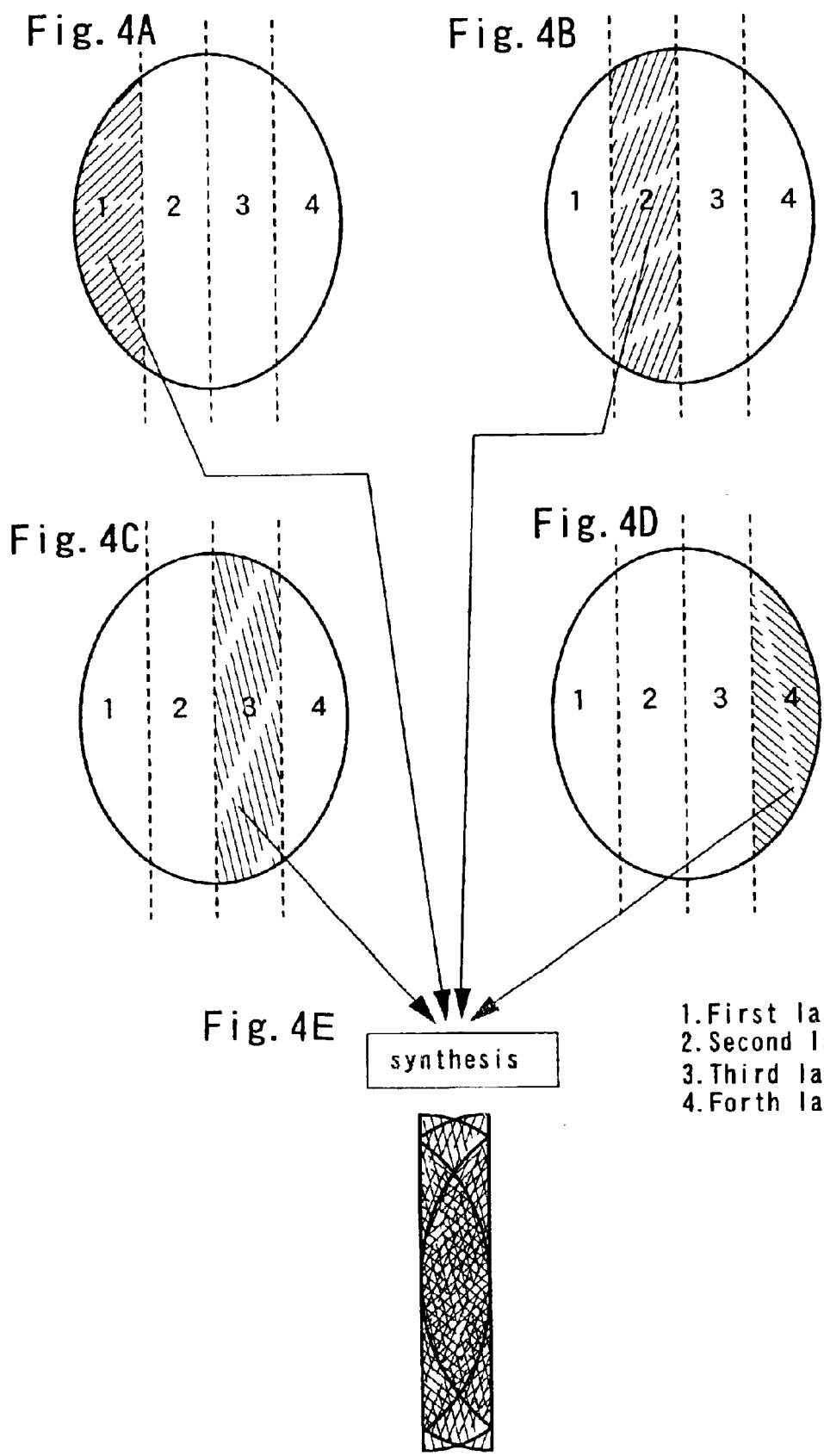
FIGS. 4A to 4E are diagrams showing an example of laser light being divided by the optical system of FIG. 3.

Laser beams emitted from the lasers 131a to 131d are divided by slits 132a to 132d having reflective surfaces, respectively, so that each laser light is divided in two directions. Positioning of a slit with respect to laser light is varied among the slits 132a to 132d, and which one of divided laser beams travels straight varies from one slit to another. The laser beams being divided by the slits are described referring to FIGS. 4A to 4D. FIGS. 4A to 4D each show a laser light shape in section perpendicular to the direction the laser light travels. FIG. 4A shows laser light emitted from the laser 131a. The laser light is divided by the slit 132a into four, and a first laser beam travels straight whereas second to fourth laser beams are reflected and absorbed in a damper 137. FIG. 4B shows laser light emitted from the laser 131b. The laser light is divided by the slit 132b into four, and a second laser beam travels straight whereas first, third, and fourth laser beams are reflected and absorbed in the damper 137. FIG. 4C shows laser light emitted from the laser 131c. The laser light is divided by the slit 132c into four, and a third laser beam travels straight whereas first, second, and fourth laser beams are reflected and absorbed in the damper 137. FIG. 4D shows laser light emitted from the laser 131d. The laser light is divided by the slit 132d into four, and a fourth laser beam travels straight whereas first to third laser beams are reflected and absorbed in the damper 137. As described, each of the slits 132a to 132d lets one laser beam out of divided laser beams to travel straight whereas the rest of the divided laser beams are reflected, and a laser beam allowed to travel straight by one slit has different energy distribution than a laser beam allowed to travel straight by another slit.

The travel directions of the laser beams that have passed through the slits 132a to 132d are changed by prisms 133a to 133d, respectively. The prisms 133a to 133d are provided to synthesize all of the four laser beams at the same irradiation position.

If laser light that reaches the irradiation surface is one at an edge of the initial laser light, it is desirable to expand the length of this laser light in the longitudinal direction by a cylindrical lens 134a or 134d. As shown in FIGS. 4A to 4D, the length of laser light is shorter at its edges than around the center. Therefore, if the lengths of laser light edges are adjusted to have the same length as the center of the laser light prior to synthesization on the irradiation surface or in the vicinity thereof, a rectangular beam of high uniformity can be obtained upon the synthesization. In this embodiment, cylindrical lenses each having a focal length of 50 mm are placed such that the curvature is parallel to the longitudinal direction.

Figure 5:
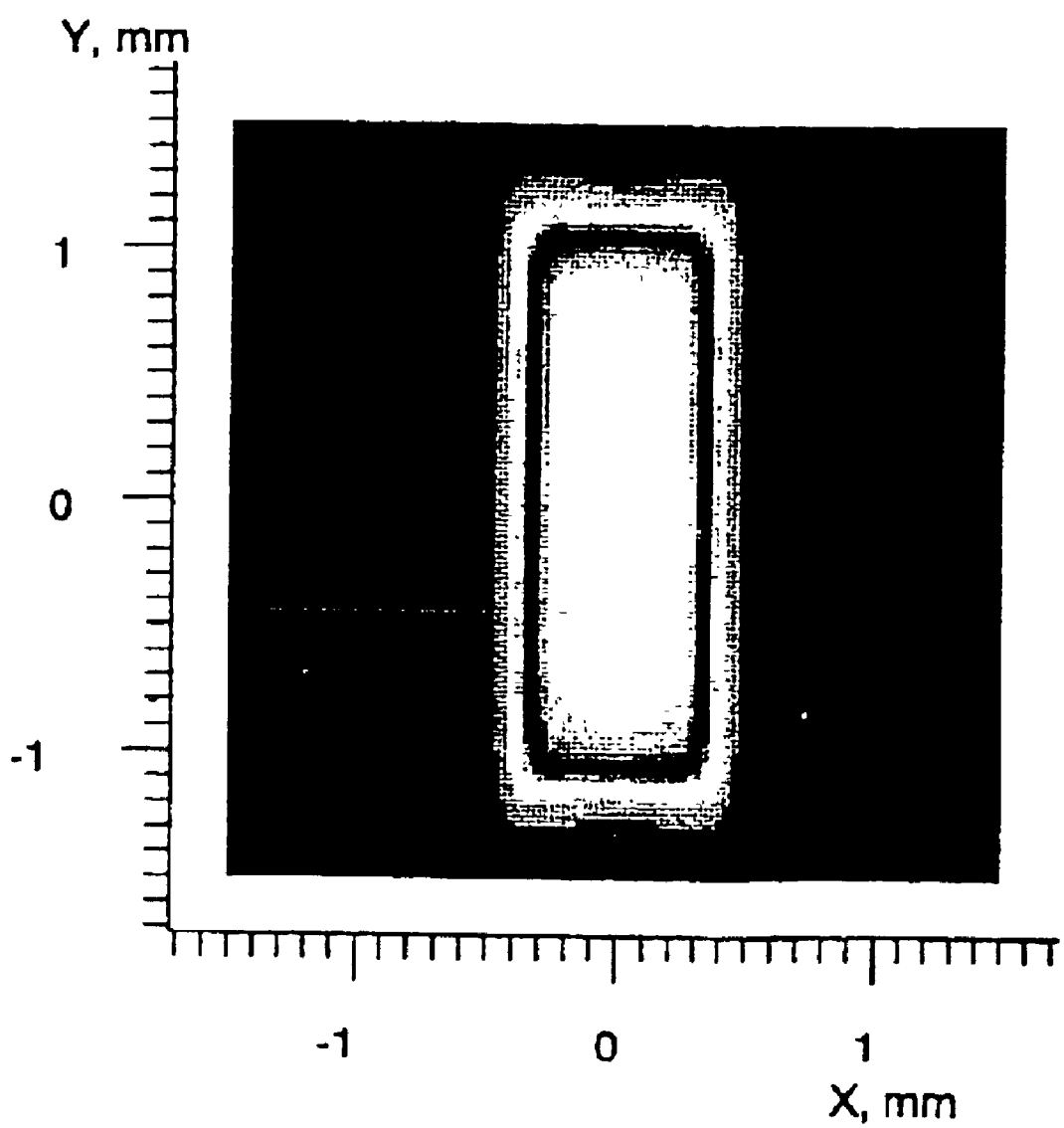
FIG. 5 is a diagram showing an example of a rectangular beam shape formed on an irradiation surface by the optical system of FIG. 3.

The laser beams are synthesized as shown in FIG. 4E on the irradiation surface by the optical system structured as above. The shape of laser light formed on the irradiation surface is simulated and the result thereof is shown in FIG. 5. FIG. 5 shows that a rectangular beam 7.1 mm in width and 22.2 mm in length is obtained. Since the laser beams used to form this rectangular beam are emitted from different lasers, interference does not take place. In addition, the rectangular beam has excellent uniformity in energy distribution because plural laser beams having different energy distributions are synthesized on the irradiation surface.

An irradiation object 108 is irradiated with the thus formed rectangular beam while moving the beam relative to the irradiation object 108 in the direction indicated by 110 or 111, for example. This way a desired region of the irradiation object 108, or the entire region thereof can be irradiated.

Although this embodiment uses four lasers and each laser light is divided into four, the present invention is not limited thereto.

If this laser irradiation apparatus is used to anneal a semiconductor film, the semiconductor film can be crystallized, the crystallinity is improved to obtain a crystalline semiconductor film, and an impurity element can be activated.

Embodiment 2

Figure 6:
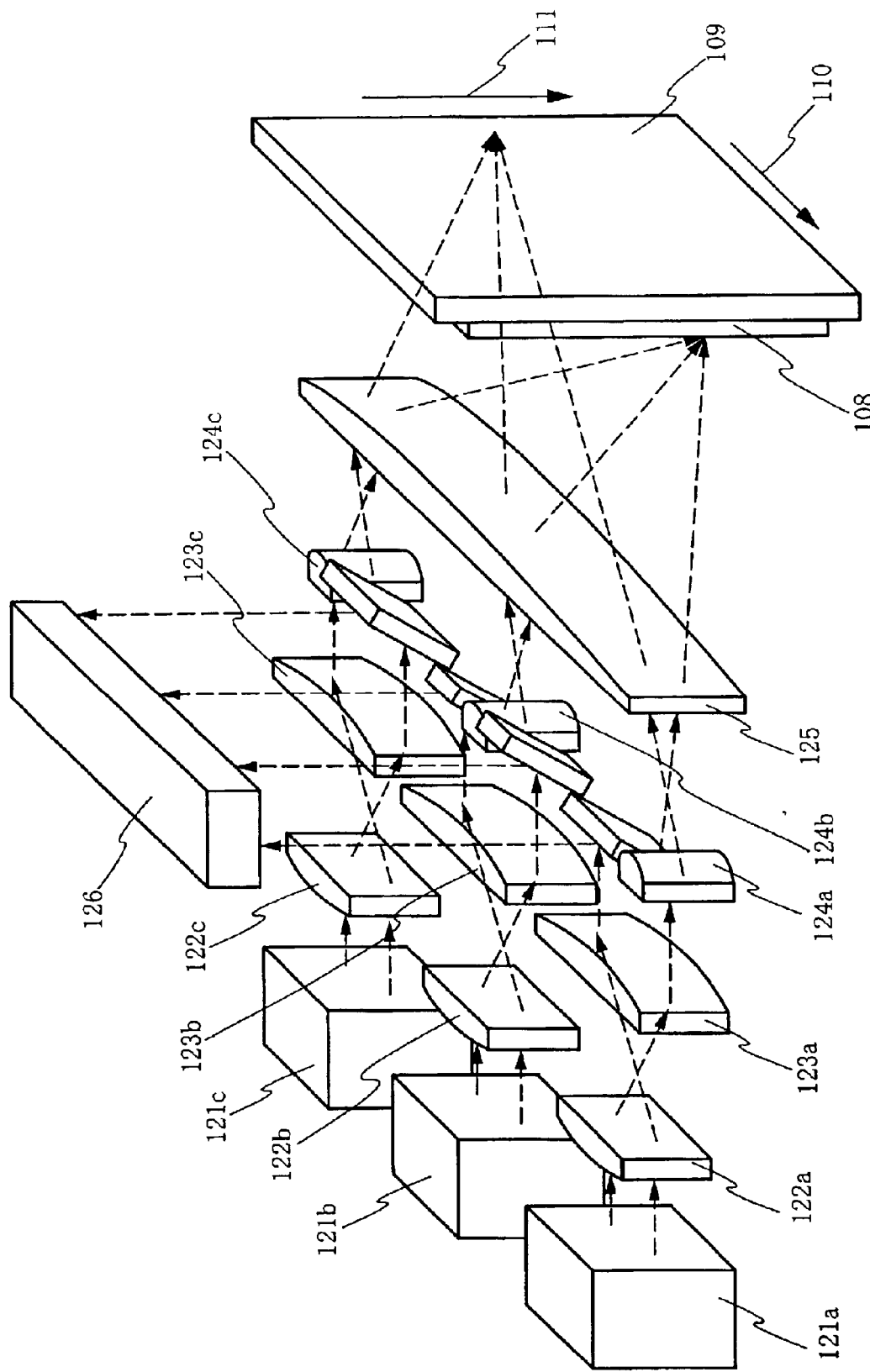
FIG. 6 is a diagram showing an example of an optical system of the present invention.

This embodiment describes with reference to FIG. 6 an example of optical system for dividing laser beams that are emitted from three lasers and overlapping laser beams that have different energy distributions from one another.

Lasers 121a to 121c each emit laser light. The lasers 121a to 121c used here are continuous wave or pulse oscillation solid-state lasers, gas lasers, or metal lasers. Examples of the solid-state lasers include a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser. Examples of the gas lasers include a continuous wave or pulse oscillation excimer laser, Ar laser, Kr laser, and $CO_2$ laser. Examples of the metal lasers include a continuous wave or pulse oscillation helium cadmium laser, copper steam laser, and gold steam laser. The laser light emitted from the lasers 121a to 121c may be converted into harmonic by a non-linear optical element.

In this embodiment, a pulse oscillation YAG laser is used and its laser light is converted into the second harmonic by a non-linear optical element.

The laser beams emitted are separately expanded by beam expanders 122a to 122c and then by beam expanders 123a to 123c. Beam expanders are effective especially when laser light emitted from a laser has a small shape, and may be omitted depending on the size of laser light. The cylindrical lenses 122a to 122c and 123a to 123c are desirably made of synthetic silica glass because it gives them high transmittance. Coating on the surfaces of the cylindrical lenses 122a to 122c and 123a to 123c is desirably capable of providing 99% or higher transmittance for the wavelength of laser light used.

The laser beams that exit the beam expanders 122a to 122c and 123a to 123c are respectively divided in two directions by optical systems 124a to 124c. Each of the optical systems 124a to 124c is a combination of a mirror and a cylindrical lens. Laser light emitted from the laser 121a is divided into three by the optical system 124a, and only the left laser light of the three travels straight whereas the other two are reflected by the mirror and reach a damper 126. Laser light emitted from the laser 121b is divided into three by the optical system 124b and only the center laser light of the three travels straight whereas the other two are reflected by the mirror and reach the damper 126. Laser light emitted from-the laser 121c is divided into three by the optical system 124c and only the right laser light of the three travels straight whereas the other two are reflected by the mirror and reach the damper 126. In this way the optical systems 124a to 124c determine which laser light travels straight and which laser light is reflected.

Alternatively, each laser light may enter a cylindrical lens array to be divided and then only a desired one out of divided laser light may be taken out using a slit that has a reflective surface.

If laser light that reaches the irradiation surface is one at an edge of the initial laser light, it is desirable to expand the length of this laser light in the longitudinal direction by a cylindrical lens or the like (not shown) because edges of laser light are shorter in length than the center of the laser light.

The laser beams that have passed through the optical systems 124a to 124c are synthesized by a cylindrical lens 125 on the irradiation surface or in the vicinity thereof to form a rectangular beam. The thus formed rectangular beam does not interfere since laser beams used to form the rectangular beam are emitted from different lasers. In addition, the rectangular beam has excellent uniformity in energy distribution because plural laser beams having different energy distributions are synthesized on the irradiation surface or the vicinity thereof.

An irradiation object 108 is irradiated with the thus formed rectangular beam while moving the beam relative to the irradiation object 108 in the direction indicated by 110 or 111, for example. This way a desired region of the irradiation object 108, or the entire region thereof can be irradiated.

If this laser irradiation apparatus is used to anneal a semiconductor film, the semiconductor film can be crystallized, the crystallinity is improved to obtain a crystalline semiconductor film, and an impurity element can be activated.

Although this embodiment uses three lasers and the laser light is divided into three, the present invention is not limited thereto.

This embodiment may be combined freely with Embodiment 1.

Embodiment 3

Figure 7:
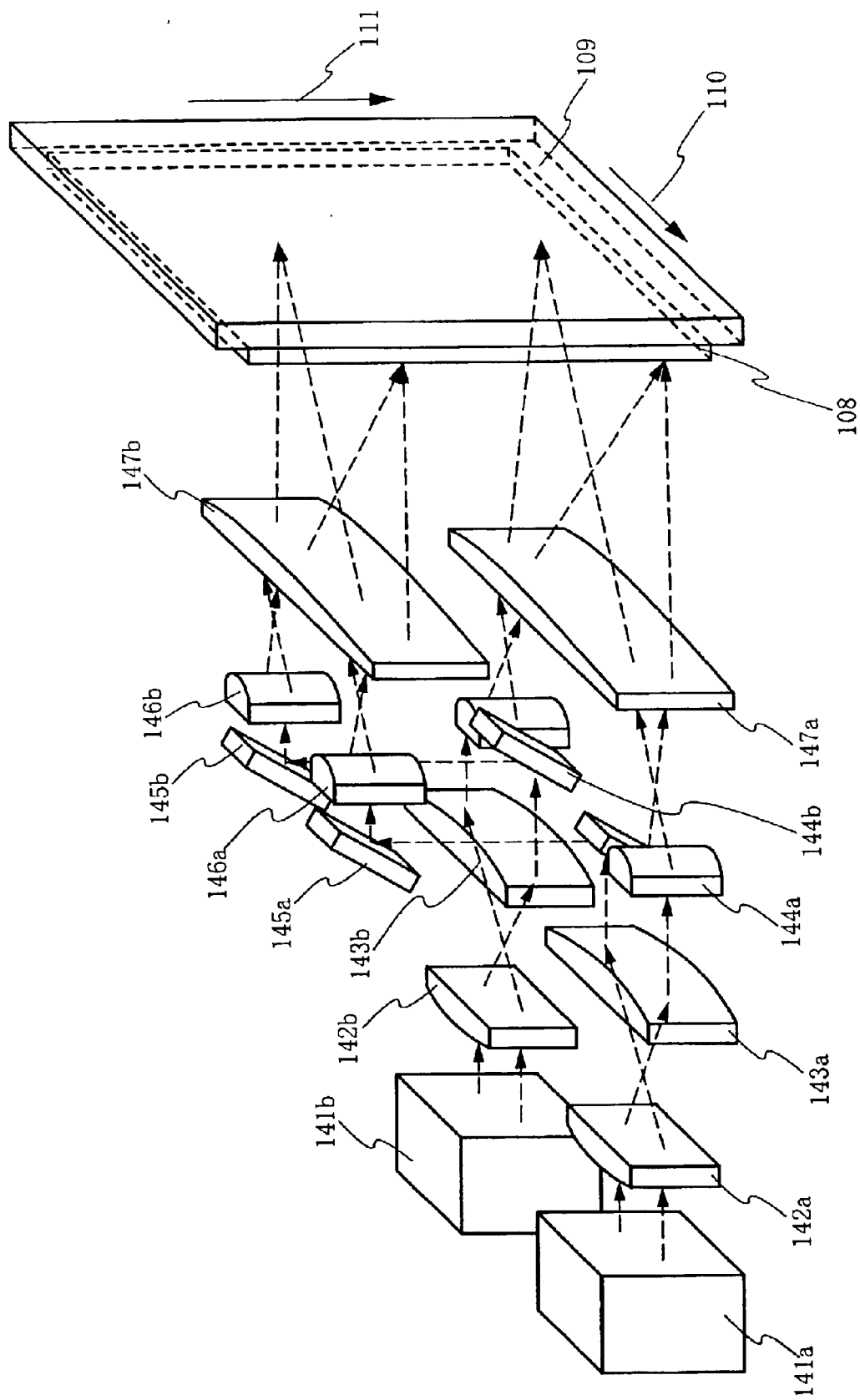
FIG. 7 is a diagram showing an example of an optical system of the present invention.

In this Embodiment, an optical system example of forming simultaneously a plurality of laser beams will be described by using the FIG. 7 that laser beams which are oscillated from two lasers are divided and laser beams whose energy densities are different from each other are overlapped.

Laser beams are respectively irradiated from laser 141a and laser 141b. Here, a solid state laser, a gas laser, or a metal laser of a continuous oscillation or a pulse oscillation are used as lasers 141a and 141b.

It should be noted that as the above-mentioned solid state laser, YAG laser, $YVO_4$ laser, YLF laser, $YAlO_3$ laser, $Y_2O_3$ laser, glass laser, ruby laser, alexandrite laser, Ti:sapphire laser or the like of continuous oscillation or pulse oscillation are listed, as the above-mentioned gas laser, excimer laser, Ar laser, Kr laser, $CO_2$ laser or the like of continuous oscillation or pulse oscillation are listed, and as the above-mentioned metal laser, helium-cadmium laser, copper vapor laser, gold vapor laser and the like are listed. Further, laser beams irradiated from laser 141a and laser 141b may be converted into the higher harmonic wave by a non-linear optical element.

In this embodiment, lasers 141a and 141b are converted into the third higher harmonic wave by a continuous oscillation YAG lasers Irradiated laser beams are expanded by beam expanders 142a and 143a or 142b and 143b. It should be noted that a beam expander is particularly effective in case, shapes of laser beams irradiated from lasers are small so that a beam expander is not used necessarily according to the size and the like of laser beams. It is desirable to obtain a high transmittance if a cylindrical lenses 142a, 143a, 142b, 143b are made of synthetic quartz glass. It is also desirable that coatings given to surfaces of lenses 142a, 143a, 142b and 143b can be obtained more than 99% transmittance against the wave length of the laser beam which is used.

Laser beam irradiated from beam expanders 142 and 143 are divided into two directions by the optical systems 144a and 144b combined mirrors and cylindrical lenses. Right laser beam of division into two which oscillated from the laser 141a by the optical system 144a goes straight and left laser beam reflects with the mirror. Left laser beam of division into two which oscillated from the laser 141b by the optical system 144b goes straight and right laser beam reflects with the mirror. In this way, laser beam are determined to go straight or to reflect by optical systems 144a and 144b.

Laser beams which go straight by optical systems 144a and 144b are synthesized at the irradiation side or near it by the cylindrical lens 147a and forms rectangular shape beams. Rectangular shape beams which formed in this way are not interfered because they are oscillated by different lasers. Rectangular shape beams with excellent uniformity of energy densities are formed because a plurality of laser beams with different energy densities are formed at the irradiation side or near it.

While, laser beams which reflect by optical systems 144a and 144b are synthesized at the irradiation side or near it by the cylindrical lenses 146a, 146b and 147b and form rectangular shape beams. Rectangular shape beams which formed in this way are not interfered because they are oscillated by different lasers. Rectangular shape beams with excellent uniformity of energy densities are formed because a plurality of laser beams with different energy densities are formed at the irradiation side or near it.

Then, while a plurality of rectangular shape beams formed in this way irradiate, they can irradiate the desired region or whole area on the irradiated body 108 by being relatively moved with respect to the irradiated body 108, for example, in the direction indicated with the reference numerals 110 and 111. Moreover, the through-put can be improved because a plurality of rectangular shape beams are formed.

The semiconductor film can be crystallized, a crystalline semiconductor film can be obtained with improving the crystalline and the activation of the impurity element can be performed if a semiconductor film is annealed by using such a laser irradiation apparatus It should be noted that in this embodiment, although an example in which two lasers are used and the division number of laser beams is two, it is not limited and the number of rectangular shape beams which are formed are not limited two.

This embodiment can be combined with Embodiments 1 or 2 freely.

Embodiment 4

Figure 8:
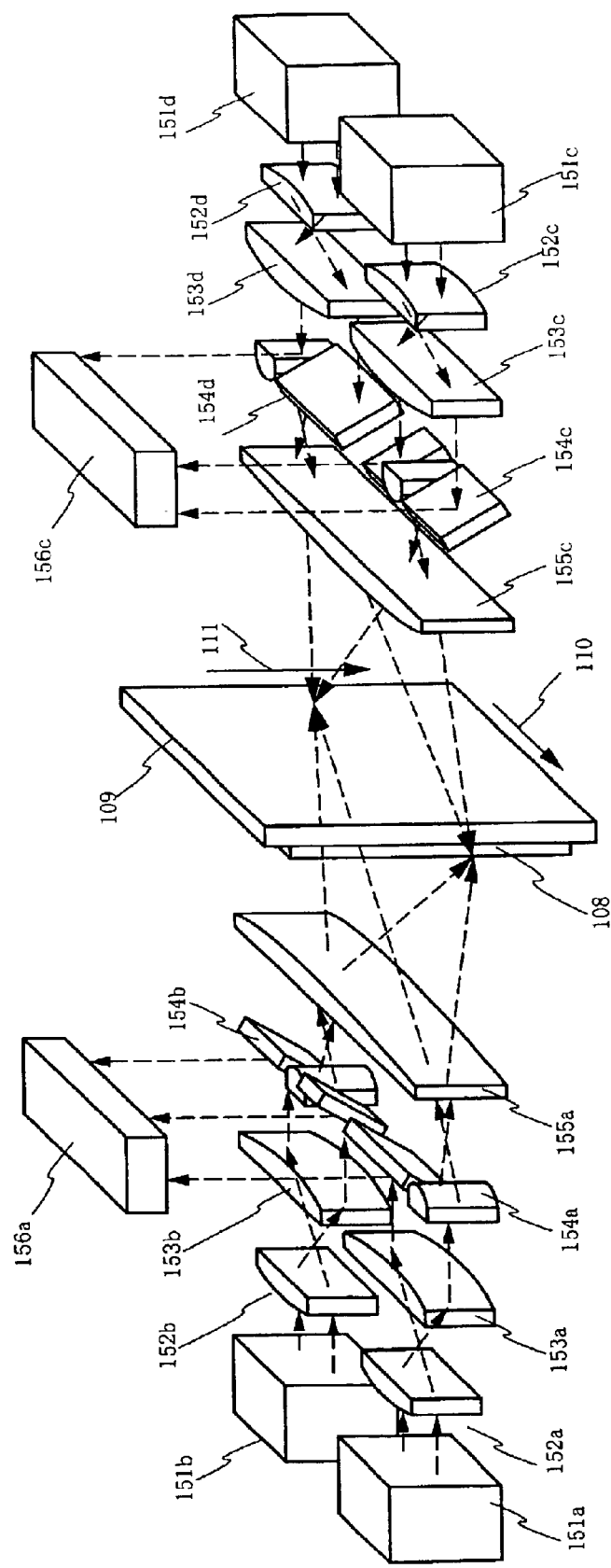
FIG. 8 is a diagram showing an example of an optical system of the present invention.

This embodiment describes with reference to FIG. 8 an example of optical system for dividing laser beams that are emitted from four lasers and overlapping laser beams that have different energy distributions from one another.

Lasers 151a to 151d each emit laser light. The lasers 151a to 151d used here are continuous wave or pulse oscillation solid-state lasers, gas lasers, or metal lasers. Examples of the solid-state lasers include a continuous wave or pulse oscillation YAG laser, YVO$_4$ laser, YLF laser, YAlO$_3$ laser, Y$_2$O$_3$ laser, glass laser, ruby laser, alexandrite laser, and Ti:sapphire laser. Examples of the gas lasers include a continuous wave or pulse oscillation excimer laser, Ar laser, Kr laser, and CO$_2$ laser. Examples of the metal lasers include a continuous wave or pulse oscillation helium cadmium laser, copper steam laser, and gold steam laser. The laser light emitted from the lasers 151a to 151d may be converted into harmonic by a non-linear optical element.

In this embodiment, a pulse oscillation YAG laser is used and its laser light is converted into the second harmonic by a non-linear optical element. The second harmonic of a YAG laser can be transmitted through a glass substrate or a quartz substrate and therefore is preferable when a substrate is irradiated from both sides as in this embodiment.

The laser beams emitted are separately expanded by beam expanders 152a to 152d and then by beam expanders 153a to 153d. Beam expanders are effective especially when laser light emitted from a laser has a small shape, and may be omitted depending on the size of laser light. The cylindrical lenses 152a to 152d and 153a to 153d are desirably made of synthetic silica glass because it gives them high transmittance. Coating on the surfaces of the cylindrical lenses 152a to 152d and 153a to 153d is desirably capable of providing 99% or higher transmittance for the wavelength of laser light used.

The laser beams that exit the beam expanders 152a to 152d and 153a to 153d are respectively divided in two directions by optical systems 154a to 154d. Each of the optical systems 154a to 154d is a combination of a mirror and a cylindrical lens. Laser light emitted from the laser 151a is divided into four by the optical system 154a, and only the most left laser light of the four travels straight whereas the other two are reflected by the mirror and reach a damper 156a. Laser light emitted from the laser 151b is divided into four by the optical system 154b and only the second left laser light of the four travels straight whereas the other regions are reflected by the mirror and reach the damper 156a. Laser light emitted from the laser 151c is divided into four by the optical system 154c and only the second right laser light of the four travels straight whereas the other three are reflected by the mirror and reach the damper 156c. Laser light emitted from the laser 151d is divided into four by the optical system 154s and only the most right laser light of the four travels straight whereas the other three are reflected by the mirror and reach the damper 156c. In this way the optical systems 154a to 154d determine which laser light travels straight and which laser light is reflected.

Alternatively, each laser light may enter a cylindrical lens array to be divided and then only a desired one out of divided laser beams may be taken out using a slit that has a reflective surface.

Though not shown, laser light at an edge of the divided regions is desirably expanded by a cylindrical lens array or the like since laser light at an edge is shorter in the longitudinal direction than laser light near the center.

The laser beams that have passed through the optical systems 154a to 154d are synthesized by cylindrical lenses 155a and 155c on the irradiation surface or in the vicinity thereof to form a rectangular beam. The thus formed rectangular beam does not interfere since laser beams used to form the rectangular beam are emitted from different lasers. In addition, the rectangular beam has excellent uniformity in energy distribution because plural laser beams having different energy distributions are synthesized on the irradiation surface or the vicinity thereof.

An irradiation object 108 is irradiated with the thus formed rectangular beam while moving the beam relative to the irradiation object 108 in the direction indicated by 110 or 111, for example. This way a desired region of the irradiation object 108, or the entire region thereof can be irradiated.

When plural laser beams irradiate one side of the substrate and are synthesized at the same irradiation position, the laser beams have different light path lengths and spread angles of the laser beams may expand the synthesized beam unnecessarily, thereby lowering uniformity in energy distribution. The structure of this embodiment is free from this problem because the plural laser beams each have the same light path length to reach the irradiation surface.

If this laser irradiation apparatus is used to anneal a semiconductor film, the semiconductor film can be crystallized, the crystallinity is improved to obtain a crystalline semiconductor film, and an impurity element can be activated.

Although this embodiment uses four lasers and each laser light is divided into four, the present invention is not limited thereto.

This embodiment may be combined freely with Embodiments 1 to 3.

Embodiment 5

Figure 9:
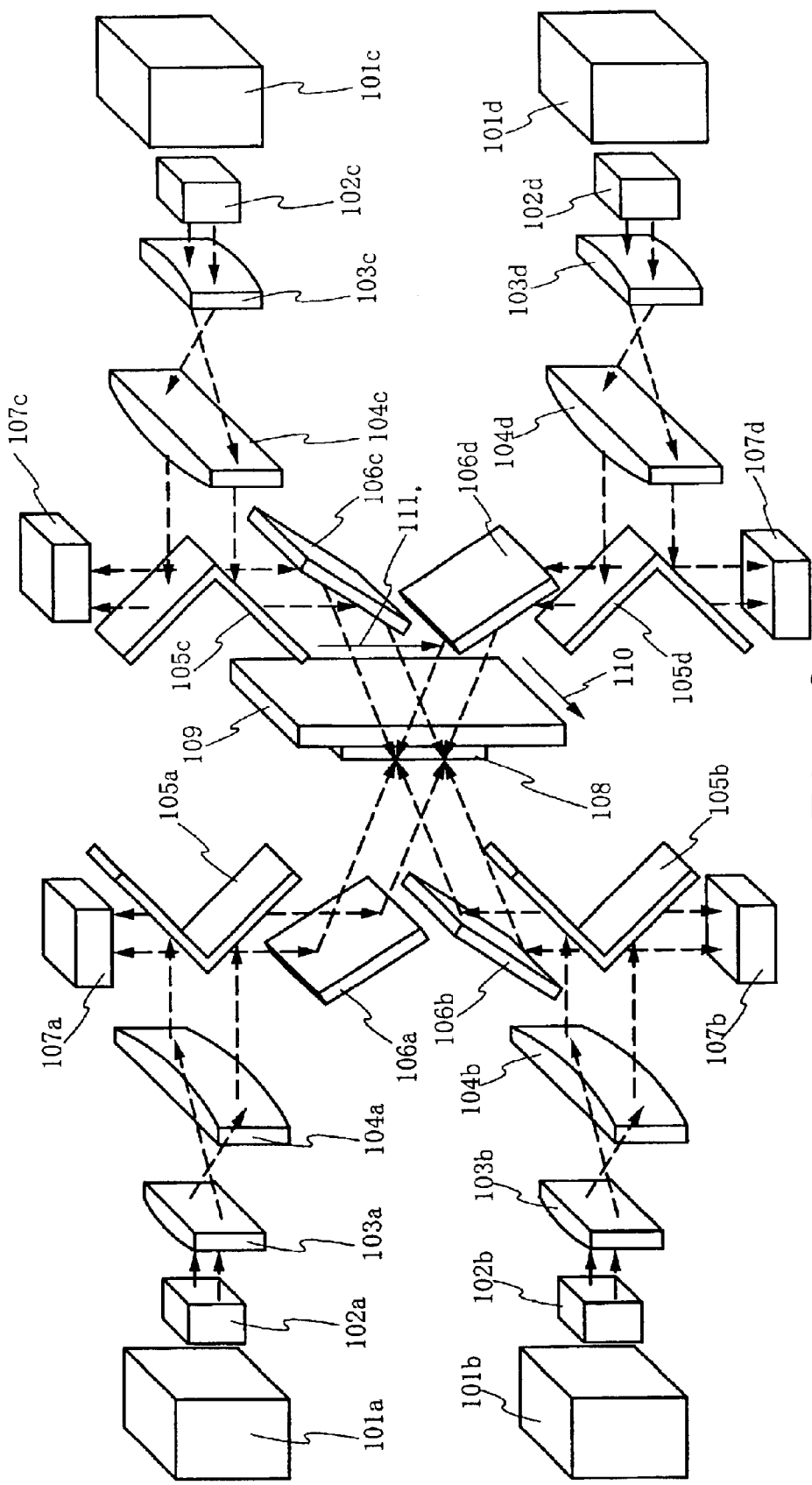
FIG. 9 is a diagram showing an example of an optical system of the present invention.
Figure 11A:
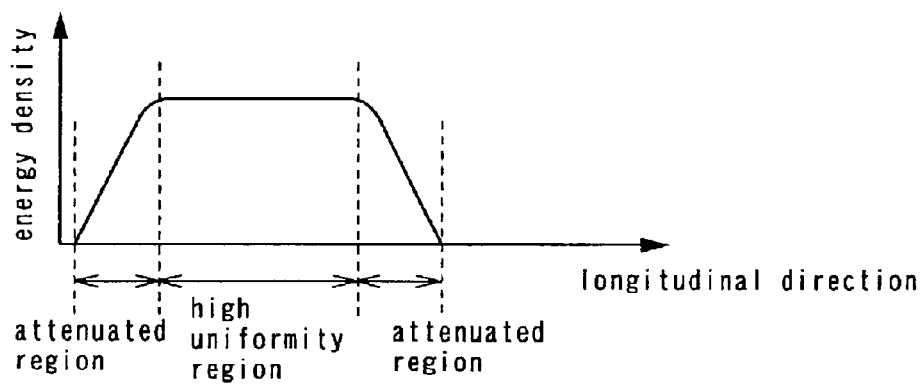
FIGS. 11A and 11B are a diagram showing an example of energy density distribution of laser light formed by a conventional optical system and a diagram showing an example of annealing a large-area substrate with the laser light shown in FIG. 11A, respectively.
Figure 11B:
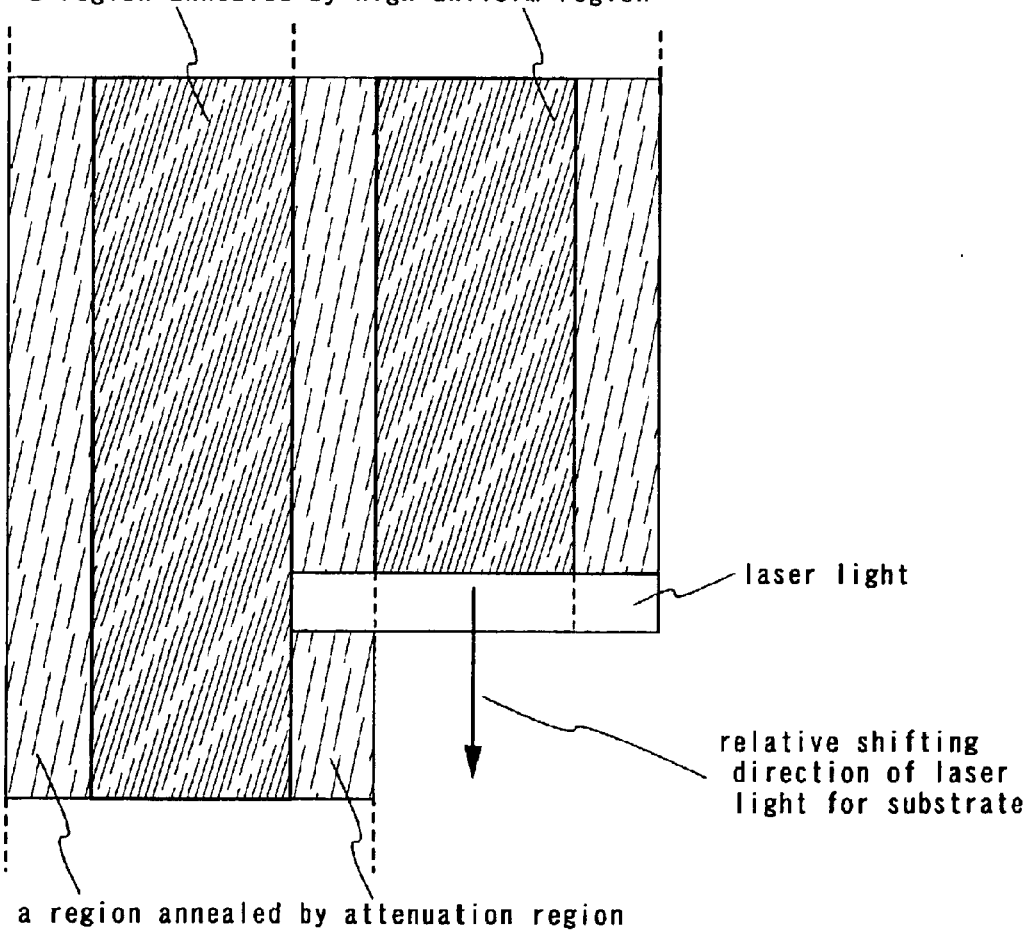

This embodiment gives a description with reference to FIG. 9 an example of optical system for dividing laser beams that are emitted from four lasers, overlapping and synthesizing laser beams that have different energy distributions, and irradiating a substrate from both sides.

In FIG. 9, an optical system is composed of lasers 101a and 101b, isolators 102a and 102b, beam expanders 103a and 104*a* or 103*b* and 104*b*, mirrors 105*a* and 105*b*, mirrors 106*a* and 106*b*, an irradiation object 108, and a stage 109. The optical system is similar to the structure shown in Embodiment Mode 1 (FIG. 1).

In this embodiment, a YLF laser is used and its laser light is converted into the second harmonic. The second harmonic of a YLF laser can be transmitted through a glass substrate or a quartz substrate and therefore is preferable when a substrate is irradiated from both sides as in this embodiment. Even when the laser has a wavelength that does not allow a substrate to transmit it, the substrate can be partially annealed and it can be used in this embodiment.

Another optical system has the structure of FIG. 1 and is composed of lasers 101*c* and 101*d*, isolators 102*c* and 102*d*, beam expanders 103*c* and 104*c* or 103*d* and 104*d*, mirrors 105*c* and 105*d*, and mirrors 106*c* and 106*d*. This optical system and the above optical system are arranged such that they are symmetrical with respect to the irradiation object 108.

With this structure, the substrate can be irradiated with rectangular beams from both sides. The irradiation object 108 is irradiated with the thus formed rectangular beams while moving the beams relative to the irradiation object 108 in the direction indicated by 110 or 111, for example. This way a desired region of the irradiation object 108, or the entire region thereof can be irradiated.

By irradiating the substrate from both sides, the energy density can be enhanced. When plural laser beams irradiate one side of the substrate and are synthesized at the same irradiation position, the laser beams each have different light path lengths and spread angles of the laser beams may expand the synthesized beam unnecessarily, thereby lowering uniformity in energy distribution. The structure of this embodiment is free from this problem because the plural laser beams each have the same light path length to reach the irradiation surface.

If this laser irradiation apparatus is used to anneal a semiconductor film, the semiconductor film can be crystallized, the crystallinity is improved to obtain a crystalline semiconductor film, and an impurity element can be activated.

Although this embodiment uses four lasers and each laser light is divided into two, the present invention is not limited thereto.

This embodiment may be combined freely with Embodiments 1 to 4.

Embodiment 6

This embodiment describes with reference to FIGS. 4A to 4E, 24, and 25 an example of optical system for dividing laser beams that are emitted from four lasers and overlapping laser beams that have different energy distributions from one another.

Lasers 131*a* to 131*d* each emit laser light. The lasers 131*a* to 131*d* used here are continuous wave or pulse oscillation solid-state lasers, gas lasers, or metal lasers. Examples of the solid-state lasers include a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser. Examples of the gas lasers include a continuous wave or pulse oscillation excimer laser, Ar laser, Kr laser, and $CO_2$ laser. Examples of the metal lasers include a continuous wave or pulse oscillation helium cadmium laser, copper steam laser, and gold steam laser. The laser light emitted from the lasers 131*a* to 131*d* may be converted into harmonic by a non-linear optical element.

In this embodiment, a continuous wave $YVO_4$ laser is used and its laser light is converted into the second harmonic by a non-linear optical element. The beam diameter of the laser light is 2.25 mm and the beam spread angle is set to 0.35 mrad.

Though not shown in the drawing, it is desirable to install isolators. This is because components of the optical system in this embodiment are arranged symmetrically and therefore reflected light of lasers on an irradiation surface may mutually affect other lasers in a way similar to return light.

Beam expanders (not shown) may be provided to expand laser light in the longitudinal direction and lateral direction. Beam expanders are effective especially when laser light emitted from a laser has a small shape.

Laser beams emitted from the lasers 131*a* to 131*d* are divided by slits 132*a* to 132*d* having reflective surfaces, respectively, so that each laser light is divided in two directions. Positioning of a slit with respect to laser light is varied among the slits 132*a* to 132*d*, and which one of divided laser beams travels straight varies from one slit to another. The laser beams being divided by the slits are described referring to FIGS. 4A to 4D. FIGS. 4A to 4D each show a laser light shape in section perpendicular to the direction the laser light travels. FIG. 4A shows laser light emitted from the laser 131*a*. The laser light is divided by the slit 132*a* into four, and a first laser beam travels straight whereas second to fourth laser beams are reflected and absorbed in a damper 135*a*. FIG. 4B shows laser light emitted from the laser 131*b*. The laser light is divided by the slit 132*b* into four, and a second laser beam travels straight whereas first, third, and fourth laser beams are reflected and absorbed in the damper 135*a*. FIG. 4C shows laser light emitted from the laser 131*c*. The laser light is divided by the slit 132*c* into four, and a third laser beam travels straight whereas first, second, and fourth laser beams are reflected and absorbed in the damper 135*c*. FIG. 4D shows laser light emitted from the laser 131*d*. The laser light is divided by the slit 132*d* into four, and a fourth laser beam travels straight whereas first to third laser beams are reflected and absorbed in the damper 135*c*. As described, each of the slits 132*a* to 132*d* lets one laser beam out of divided laser beams to travel straight whereas the rest of the divided laser beams are reflected, and a laser beam allowed to travel straight by one slit has different energy distribution than a laser beam allowed to travel straight by another slit.

Laser beams that have passed through the slits 132*a* to 132*d* enter convex lenses 134*a* to 134*d*4, respectively, at angles. This causes aberration such as astigmatism to shift the focal point and make it possible to form a rectangular beam 106 on an irradiation surface or in the vicinity thereof. In this embodiment, the radius of curvature of the convex lenses 134*a* and 134*d* is set to 7 mm and the radius of curvature of the convex lenses 134*b* and 134*c* is set to 9 mm. As shown in FIGS. 4A to 4D, the length of laser light is shorter at edges than around the center. Therefore, by giving different radii of curvature, laser light at an edge of initial laser light is expanded in length in the longitudinal direction more than laser light at the center of the initial laser light is expanded. This way a rectangular beam of high uniformity can be obtained upon synthesization on the irradiation surface or in the vicinity thereof. Alternatively, a cylindrical lens or the like may be used to expand laser light in the longitudinal direction if the laser light that reaches the irradiation surface is one at an edge of the initial laser light.

Figure 25:
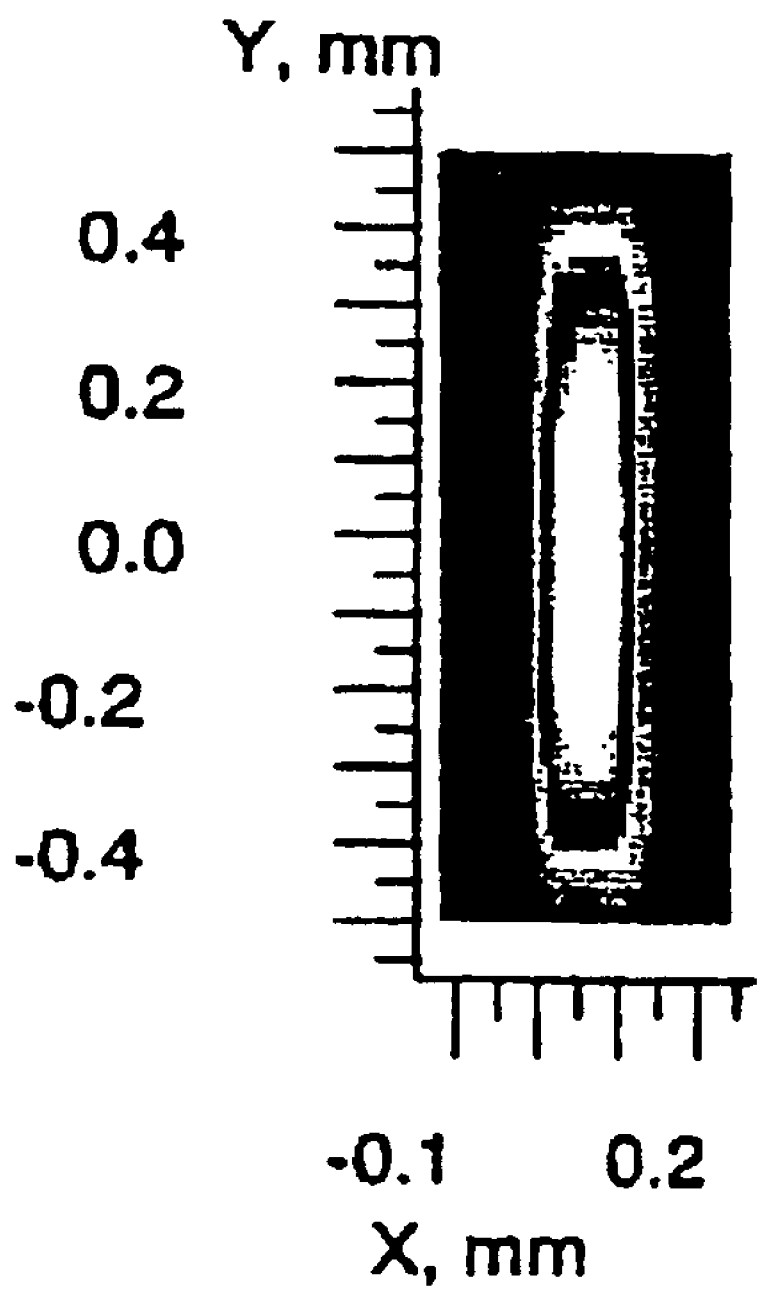
FIG. 25 is a diagram showing an example of a laser light shape formed on an irradiation surface by the present invention.

The shape of laser light formed on the irradiation surface by the optical system structured as above is shown in FIG. 4E. The shape of laser light formed on the irradiation surface is simulated and the result thereof is shown in FIG. 25. FIG. 25 shows that a rectangular beam 190 μm in width and 950

μm in length is obtained. Since the laser beams used to form this rectangular beam are emitted from different lasers, interference does not take place. In addition, the rectangular beam has excellent uniformity in energy distribution because plural laser beams having different energy distributions are synthesized on the irradiation surface.

An irradiation object 105 is irradiated with the thus formed rectangular beam while moving the beam relative to the irradiation object 105 in the direction indicated by 108 or 109, for example. This way a desired region of the irradiation object 105, or the entire region thereof can be irradiated.

Although this embodiment uses four lasers and each laser light is divided into four, the present invention is not limited thereto.

If this laser irradiation apparatus is used to anneal a semiconductor film, the semiconductor film can be crystallized, the crystallinity is improved to obtain a crystalline semiconductor film, and an impurity element can be activated.

Embodiment 7

A method of manufacturing an active matrix substrate is explained in this embodiment using FIGS. 12 to 15. A substrate on which a CMOS circuit, a driver circuit, and a pixel portion having a TFT pixel and a holding capacity are formed together is called active matrix substrate for convenience.

First, a substrate 400 made from glass such as barium borosilicate glass or aluminum borosilicate glass is used in this embodiment. Note that substrates such as quartz substrates, silicon substrates, metallic substrates, and stainless steel substrates having an insulating film formed on the substrate surface may also be used as the substrate 400. Further, a plastic substrate having heat resisting properties capable of enduring the processing temperatures used in this embodiment may also be used. Because this invention can form a plurality of rectangular shape beams with a uniform energy distribution, it is possible that annealing the large area substrate is conducted effectively by using a plurality of rectangular shape beams.

Next, a base film 401 made from an insulating film such as a silicon oxide film, a silicon nitride film, or a silicon oxynitride film is then formed on the substrate 400 by the known method. A two layer structure is used as the base film 401 in this embodiment, but a single layer of the above-mentioned insulating film may also be used, and a structure in which more than two layers are laminated may also be used.

Next, semiconductor layers are formed on the base film. First of all, semiconductor film is formed with a thickness of 25 to 200 nm (preferably 30 to 150 nm) by a known method (such as the sputtering method, the LPCVD method, and the plasma CVD method). Then, the semiconductor film is crystallized by a laser crystallization method. As the laser crystallization method, the laser beam irradiates to the semiconductor film by applying one of Embodiments 1 to 6 or by freely combining any one of Embodiments 1 to 6. It is desirable that a solid-state laser of continuous oscillation or pulse oscillation, a gas laser, or metallic laser is used. Note that, as the above-mentioned solid-state laser, there may be given a YAG laser of a continuous oscillation or pulse oscillation, a YVO$_4$ laser, a YLF laser, a YAlO$_3$ laser, Y$_2$O$_3$ laser, a glass laser, a ruby laser, an alexandrite laser, a Ti:sapphire laser, and the like. As the above-mentioned gas laser, there may be given a excimer laser of continuous oscillation or pulse oscillation, Ar laser, Kr laser, CO$_2$ laser, or the like. And as the above-mentioned metallic laser, there may be given a helium cadmium laser, a copper vapor laser, or a gold vapor laser. Of course, not only the laser crystallization method but also any other known crystallization method (RTA, the thermal crystallization method using a furnace annealing, the thermal crystallization method using metallic elements which promote crystallization) may also be combined. The above-mentioned semiconductor film may be an amorphous semiconductor film, a microcrystal semiconductor film, a crystalline semiconductor film and the like. Alternatively, the semiconductor film may be a compound semiconductor film having an amorphous structure such as an amorphous silicon germanium film.

In this embodiment, plasma CVD method is used to form an amorphous silicon film with a thickness of 50 nm, and then the thermal crystallization method using metallic elements, which promote crystallization, and laser crystallization method are used for the amorphous silicon film. Nickel is used as a metal element, and is introduced onto the amorphous silicon film by a solution coating method. Then heat treatment is conducted at 550° C. for five hour, whereby obtaining a first crystalline silicon film. Subsequently, the laser beam shot from a continuous oscillation YVO$_4$ laser with output 10 W is converted into the second higher harmonic wave by a nonlinear optical element and then a rectangular shape beam is formed and irradiated by one of the optical system shown in Embodiments 1 thorough 6 or by the optical system combined these embodiments, whereby obtaining a second crystalline silicon film. Irradiating the laser beam to the first crystalline silicon film, and changing the first crystalline silicon film to the second crystalline silicon film improve the crystallinity of the second crystalline silicon film. At this moment, about 0.01 to 100 MW/cm$^2$ (preferably 0.1 to 10 MW/cm$^2$) is necessary for the energy density. The stage is relatively moved to the laser beam at a speed of about 0.5 to 2000 cm/s, and it irradiates, and then the crystalline silicon film is formed. When the excimer laser of pulse oscillation is used, it is desirable that 300 Hz of frequency and 100 to 1000 mJ/cm$^2$ (typically, 200 to 800 mJ/cm$^2$) of laser energy density are used. At this moment, laser beam may be overlapped by 50 to 98%.

Of course, although a TFT can be formed by using the first crystalline silicon film, it is desirable that the second crystalline silicon film is used to form the TFT since the second crystalline silicon film has an improved crystallinity and electric characteristics of TFT are improved. For instance, although, when TFT is formed by using the first crystalline silicon film, a mobility is almost 300 cm$^2$/Vs, when TFT is formed by using the second crystalline silicon film, the mobility is extremely improved with about 500 to 600 cm$^2$/Vs.

The semiconductor layers 402 to 406 are formed by performing patterning processing on thus obtained semiconductor film by using the photolithography method.

Doping of a very small amount of an impurity element (boron or phosphorous) may be performed after forming the semiconductor layers 402 to 406 in order to control a TFT threshold value.

A gate insulating film 407 is formed next, covering the semiconductor layers 402 to 406. The gate insulating film 407 is formed by an insulating film containing silicon with a thickness of 40 to 150 nm using plasma CVD or sputtering. In this embodiment, a silicon oxynitride film having a film thickness of 110 nm is formed by plasma CVD method. The gate insulating film is of course not limited to a silicon oxynitride film, and other insulating films containing silicon may be used in a single layer or in a lamination structure.

Further, if a silicon oxide film is used, it can be formed by plasma CVD method with a mixture of TEOS (Tetraethyl Orthosilicate) and $O_2$, at a reaction pressure of 40 Pa, with the substrate temperature set from 300 to 400° C., and by discharging at a high frequency (13.56 MHz) electric power density of 0.5 to 0.8 W/cm². Good characteristics as a gate insulating film can be obtained by subsequently performing thermal annealing, at between 400 and 500° C., of the silicon oxide film thus manufactured.

A first conductive film 408 having a film thickness of 20 to 100 nm, and a second conductive film 409 having a film thickness of 100 to 400 nm are then formed and laminated on the gate insulating film 407. The first conductive film 408, made from a TaN film having a film thickness of 30 nm, and the second conductive film 409, made from a W film having a film thickness of 370 nm, are formed and laminated in this embodiment. The TaN film is formed by sputtering, and sputtering of a Ta target is performed in a nitrogen atmosphere. Further, the W film is formed by sputtering using a W target. In addition, the W film can also be formed by thermal CVD method using tungsten hexafluoride ($WF_6$). Whichever is used, it is necessary to be able to make the film become low resistance in order to use it as a gate electrode, and it is desirable that the resistivity of the W film be made less than 20 $\mu\Omega$cm.

Note that although the first conductive film 408 is TaN and the second conductive film 409 is W in this embodiment, there are no particular limitations placed on the conductive films. The first conductive film 408 and the second conductive film 409 may also be formed from an element selected from the group consisting of Ta, W, Ti, Mo, Al, Cu, Cr, and Nd, or from an alloy material having one of these elements as its main constituent, or from a chemical compound of these elements. Further, a semiconductor film, typically a polycrystalline crystalline silicon film, into which an impurity element such as phosphorous is doped may also be used, as may an AgPdCu alloy.

Masks 410 to 415 are formed next from resist using a photolithography method, and a first etching process is performed in order to form electrodes and wirings. The first etching processing is performed in accordance with first and second etching conditions (FIG. 12B). An ICP (Inductively Coupled Plasma) etching method is used as a first etching condition in this embodiment. A gas mixture of $CF_4$, $Cl_2$, and $O_2$ is used as an etching gas, the gas flow rates are set to 25:25:10 (sccm), respectively, a plasma is generated by supplying a 500 W RF (13.56 MHz) electric power to a coil shape electrode at a pressure of 1 Pa, and etching is performed. A 150 W RF (13.56 MHz) electric power is also applied to the substrate side (sample stage), thereby applying a substantially negative self-bias voltage. The W film is etched under the first etching conditions, and the edge portion of the first conductive layer is made into a tapered shape.

The etching conditions are changed to a second etching condition without removing the masks 410 to 415 made of resist. A gas mixture of $CF_4$ and $Cl_2$ is used as an etching gas, the gas flow rates are set to 30:30 (sccm), respectively, a plasma is generated by applying a 500 W RF (13.56 MHz) electric power to a coil shape electrode at a pressure of 1 Pa, and etching is performed for approximately 30 seconds. A 20 W RF (13.56 MHz) electric power is also supplied to the substrate side (sample stage), thereby applying a substantially negative self-bias voltage. The W film and the TaN film are both etched by on the same order by the second etching conditions using the gas mixture of $CF_4$ and $Cl_2$. Note that the etching time may be increased on the order of 10 to 20% in order to perform etching such that no residue remains on the gate insulating film.

Edge portions of the first conductive layer and the second conductive layer are made into a tapered shape in accordance with the effect of a bias voltage, applied to the substrate side, by making the shapes of the resist masks suitable with the above-mentioned first etching condition. The angle of the tapered portions is from 15 to 45°. First shape conductive layers 417 to 422 (first conductive layers 417a to 422a, and second conductive layers 417b to 422b) are thus formed from the first conductive layers and the second conductive layers by the first etching process. Reference numeral 416 denotes a gate insulating film, and regions not covered by the first shape conductive layers 417 to 422 become thinner by approximately 20 to 50 nm through etching.

A second etching process is then performed without removing the masks made of resist (FIG. 12C). Here, W film is selectively etched by using $CF_4$, $Cl_2$, and $O_2$ for the etching gas. At this time, the second conductive layers 428b to 433b are formed by the second etching process. On the other hand, the first conductive layers 417a to 422a are hardly etched and the second shape conductive layers 428 to 433 are formed.

A first doping process is then performed without removing the masks made of resist and the semiconductor layer is added to the impurity element which imparts n-type at a low concentration. The doping process may be performed by ion doping method or ion injection method. Ion doping is performed with process conditions in which the dosage is set from $1\times10^{13}$ to $5\times10^{14}/cm^2$, and the acceleration voltage is set between 40 to 80 keV. Doping is performed in this embodiment with the dosage set to $1.5\times10^{13}/cm^2$, and the acceleration voltage set to 60 keV. An element belonging to the group 15, typically phosphorous (P) or arsenic (As) is used as an impurity element which imparts n-type. Phosphorous (P) is used here. In this case the conductive layers 428 to 433 act as masks with respect to the impurity element which imparts n-type conductivity, and the impurity regions 423 to 427 are formed in a self-aligning manner. The impurity element which imparts n-type is added to the impurity regions 423 to 427 at a concentration in a range of $1\times10^{18}$ to $1\times10^{20}/cm^3$.

Figure 13A:
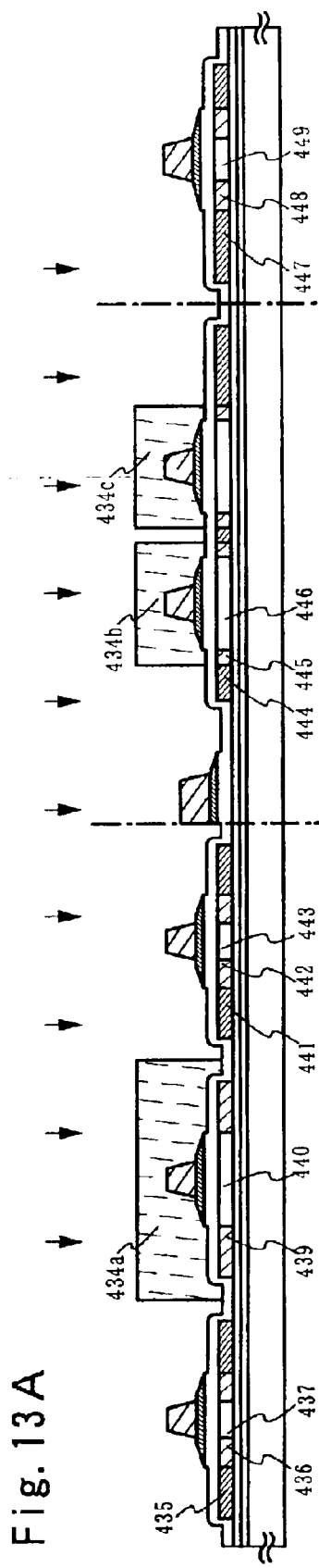
FIGS. 13A to 13C are sectional views showing a process of manufacturing a pixel TFT and TFTs of a driving circuit.

Next, after removing the masks made of resist, new masks 434a to 434c made of resist are formed, and the second doping process is performed in higher acceleration voltage than the first doping process. Ion doping is performed with process conditions in which the dosage is set from $1\times10^{13}$ to $1\times10^{15}/cm^2$, and the acceleration voltage is set between 60 to 120 keV The doping process is performed by using the second conductive layers 428b to 432b as masks and the semiconductor layer under the tapered portion of the first conductive layer is added to the impurity element. Continuously the acceleration voltage is lowered than the second doping process, the third doping process is done, and the state of FIG. 13A is obtained. Ion doping method is performed with process conditions in which the dosage is set from $1\times10^{15}$ to $1\times10^{17}/cm^2$, and the acceleration voltage is set between 50 to 100 keV. Low concentration impurity regions 436, 442 and 448 overlapping with the first conductive layer are added to the impurity element, which imparts n-type within the range of the density of $1\times10^{18}$ to $5\times10^{19}/cm^2$ by the second doping process and the third doping process and high concentration impurity regions 435, 441, 444 and 447 are added to the impurity element, which imparts n-type within the range of the density of $1\times10^{19}$ to $5\times10^{21}/cm^2$.

Of course, the second doping process and the third doping process can be one-time doping processes by making it to a suitable acceleration voltage and it is also possible to form the low concentration impurity region and high concentration impurity region.

Figure 13B:
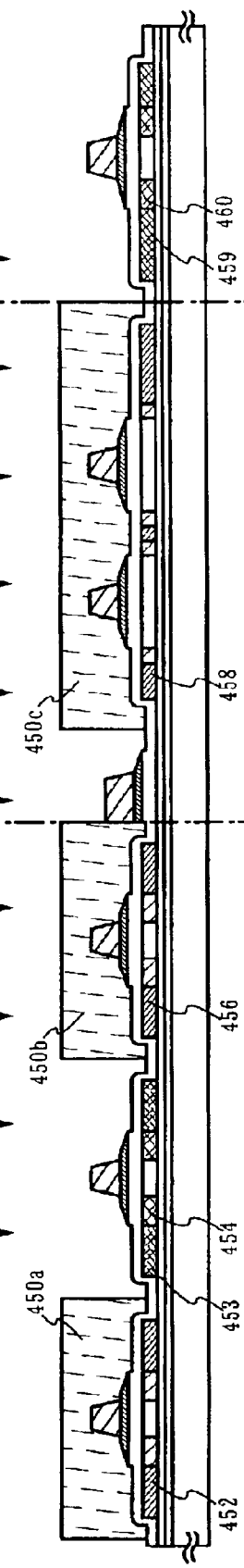

Next, after removing the masks made of resist, new masks 450a to 450c made from resist are formed and the fourth doping process is performed. Impurity regions 453, 454, 459 and 460, to which an impurity element which imparting a conductivity type opposite to that of the above one conductivity type is added, are formed in accordance with the fourth doping process in the semiconductor films which become active layers of the p-channel type TFTs. The first conductive layers 429a to 432a are used as masks with respect to the impurity element, and an impurity element which imparts p-type conductivity is added to form the impurity regions in a self-aligning manner. The impurity regions 453, 454, 459 and 460 are formed by ion doping method using diborane ($B_2H_6$) in this embodiment (FIG. 13B). The semiconductor layers for forming the n-channel type TFT are covered with the masks 450a to 450c made of resist when the fourth doping process is performed. Phosphorous is added at different concentrations into the impurity regions 453, 454, 459 and 460 by the first to third doping processes. However, by performing doping such that the concentration of the impurity element which imparts p-type conductivity becomes from $1\times10^{19}$ to $5\times10^{21}$ atoms/cm$^3$ in the respective regions, no problems develop in making the regions function as source regions and drain regions of the p-channel type TFT.

The impurity regions are thus formed in the respective semiconductor layers by the steps up through this point.

A first interlayer insulating film 461 is formed next after removing the masks 450a to 450c made of resist. This first interlayer insulating film 461 is formed from an insulating film containing silicon, having a thickness of 100 to 200 nm, by using plasma CVD method or sputtering method. A silicon oxynitride film having a thickness of 150 nm is formed by plasma CVD method in this embodiment. The first interlayer insulating film 461 is of course not limited to a silicon oxynitride film, and other insulating films containing silicon may also be used, as a single layer or a lamination structure.

Figure 13C:
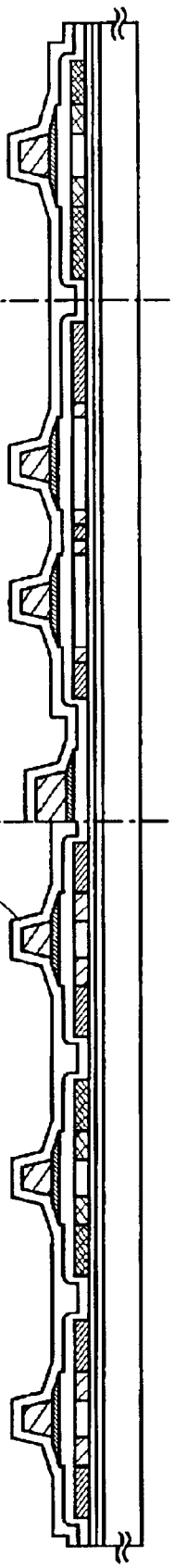

Subsequently, a recovery of the crystallinity of the semiconductor layer and an activation of the impurity elements added to the respective semiconductor layers are performed by irradiating the laser beam, as shown in FIG. 13C. As the laser activation, the laser beam irradiates to the semiconductor film by applying one of Embodiments 1 to 6 or by freely combining with these embodiments. It is desirable that a solid-state laser of a continuous oscillation or a pulse oscillation, a gas laser, or metallic laser is used. Note that, as the above-mentioned solid-state laser, there may be given a YAG laser of a continuous oscillation or a pulse oscillation, a $YVO_4$ laser, a YLF laser, a $YAlO_3$ laser, a $Y_2O_3$ laser a glass laser, a ruby laser, an alexandrite laser, a Ti:sapphire laser, and the like. As the above-mentioned gas laser, there may be given a excimer laser of continuous oscillation or pulse oscillation, Ar laser, Kr laser, $CO_2$ laser, or the like. And as the above-mentioned metallic laser, there may be given a helium cadmium laser, a copper vapor laser, or a gold vapor laser. At this moment, if a continuous oscillation laser is used, about 0.01 to 100 MW/cm$^2$ (preferably 0.01 to 10 MW/cm$^2$) is necessary for the energy density of laser beam. The substrate is relatively moved to the laser beam at a speed of about 0.5 to 2000 cm/s. And, if a pulse oscillation laser is used, it is desirable that 300 Hz of frequency and 50 to 1000 mJ/cm$^2$ (typically, 50 to 500 mJ/cm$^2$) of laser energy density are used. At this moment, laser beam may be overlapped by 50 to 98%. Besides laser annealing method, thermal annealing method or rapid thermal annealing method (RTA method) and the like can be applied.

Further, the activation may also be performed before the formation of a first interlayer insulating film. However, if the wiring material used is weak with respect to heat, then it is desirable to perform the activation processing after forming an interlayer insulating film (an insulating film having silicon as its main constituent, for example a silicon nitride film) in order to protect the wirings and the like, as in this embodiment.

Then, a heat treatment can also be performed (at 300 to 550° C. for 1 to 12 hours) and it is possible to conduct a hydrogenation. This process is one of terminating dangling bonds in the semiconductor layers by hydrogen contained within the first interlayer insulating film 461. The semiconductor layers can be hydrogenated whether or not the first interlayer insulating film exists. Plasma hydrogenation (using hydrogen excited by a plasma), and a heat treatment for 1 to 12 hours at a temperature of 300 to 450° C. in an atmosphere containing hydrogen of from 3 to 100% may also be performed as other means of hydrogenation.

Subsequently, a second interlayer insulating film 462 made from an inorganic insulating film material or from an organic insulating material is formed on the first interlayer insulating film 461. An acrylic resin film having a film thickness of 1.6 μm is formed in this embodiment, and the material used may have a viscosity from 10 to 1000 cp, preferably between 40 to 200 cp. A material in which unevenness is formed on its surface is used.

In order to prevent mirror reflection, the surface of a pixel electrode is made uneven by forming a second interlayer insulating film which forms an uneven surface (not shown) in this embodiment. Further, the pixel electrode surface can be made to be uneven and have light scattering characteristics, and therefore a convex portion may also be formed in a region below the pixel electrode. The formation of the convex portion can be performed by the same photomask as that for forming the TFTs, and therefore it can be formed without increasing the number of process steps. Note that the convex portion may also be formed appropriately on the substrate of the pixel portion region except the wirings and TFTs. In this way, unevenness is formed in the surface of the pixel electrode along the unevenness formed in the surface of the insulating film which covers the convex portion.

A film having a level surface may also be used as the second interlayer insulating film 462. In this case, it is desirable that the surface be made uneven by an added process such as a known sandblasting process or etching process to prevent mirror reflection, and thereby increasing whiteness by scattering reflected light.

Figure 14:
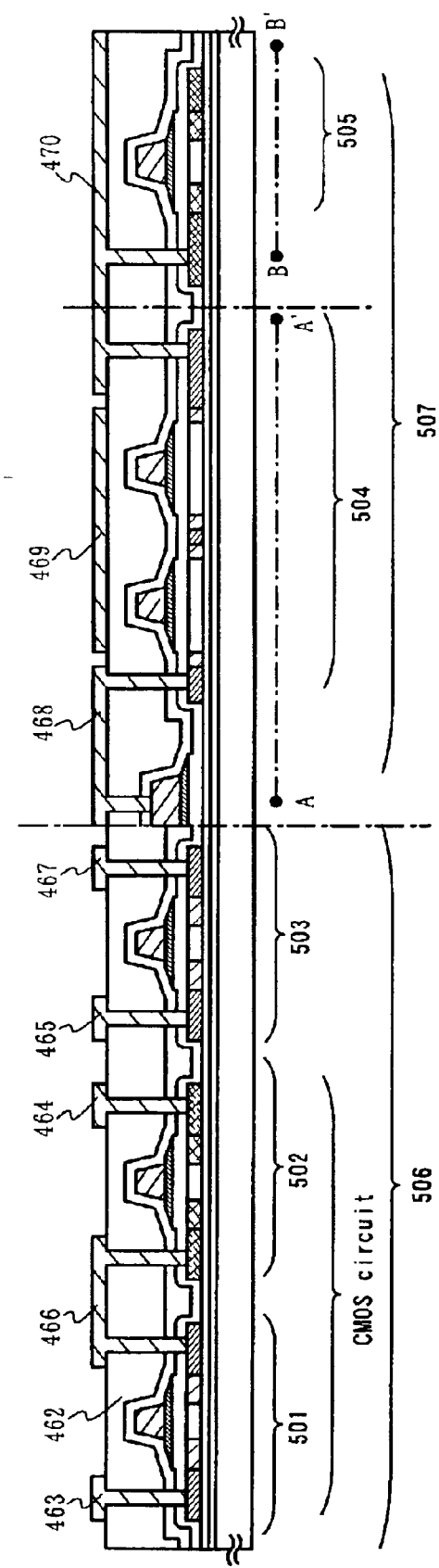
FIG. 14 is a sectional view showing a process of manufacturing a pixel TFT and TFTs of a driving circuit.

Wirings 463 to 467 for electrically connecting respective impurity regions are then formed in a driver circuit 506. Note that a lamination film of a Ti film having a thickness of 50 nm and an alloy film (an alloy of Al and Ti) having a thickness of 500 nm is patterned in order to form the wirings. Of course, it is not limited to the two-layer structure, the single-layer structure or the lamination structure more than three layers may also be acceptable. Further, Al and Ti are not limited to the wiring material. For example, Al and Cu are formed on TaN film, and the lamination film forming the Ti film is formed by the patterning and form wiring (FIG. 14).

Further, a pixel electrode 470, a gate wiring 469, and a connection electrode 468 are formed in a pixel portion 507.

An electrical connection is formed with the pixel TFT and the source wiring (lamination of 433a and 433b) by the connection electrode 468. Further, the gate wiring 469 forms an electrical connection with the gate electrode of the pixel TFT. The pixel electrode 470 forms an electrical connection with the drain region 444 of the pixel TFT, and in addition, forms an electrical connection with the semiconductor layer 459 which functions as one electrode forming a storage capacitor. It is desirable to use a material having superior reflectivity, such as a film having Al or Ag as its main constituent, or a lamination film of such films, as the pixel electrode 470.

A CMOS circuit composed of a n-channel TFT 501 and a p-channel TFT 502, a driver circuit 506 having a n-channel TFT 503, and the pixel portion 507 having a pixel TFT 504 and a storage capacitor 505 can thus be formed on the same substrate. The active matrix substrate is thus completed.

The n-channel TFT 501 of the driver circuit 506 has: a channel forming region 437; the low concentration impurity region 436 (GOLD region) which overlaps with the first conductive layer 428a that structures a portion of the gate electrode; and the high concentration impurity region 452 which functions as a source region or a drain region. The p-channel TFT 502, which forms the CMOS circuit with the n-channel TFT 501 and the electrode 466 by an electrical connection has: a channel forming region 455; the low concentration impurity region 454; and the impurity region 453 in which the impurity elements imparting n-type and p-type are introduced. Further, the n-channel TFT 503 has: a channel forming region 443; the low concentration impurity region 442 (GOLD region) which overlaps with the first conductive layer 430a that structures a portion of the gate electrode; and the high concentration impurity region 456 which functions as a source region or a drain region.

The pixel TFT 504 of the pixel portion has: a channel forming region 446; the low concentration impurity region 445 (LDD region) formed on the outside of the gate electrode; and the high concentration impurity region 458 which functions as a source region or a drain region. Further, an impurity element which imparts n-type and an impurity element which imparts p-type are added to the semiconductor layer which functions as one electrode of the storage capacitor 505. The storage capacitor 505 comprises an electrode (lamination of 432a and 432b) and the semiconductor layer, with the insulating film 416 functioning as a dielectric.

Edge portions of the pixel electrodes are disposed so as to overlap with source wirings such that gaps between the pixel electrodes shield the light, without using a black matrix, with the pixel structure of this embodiment.

Figure 15:
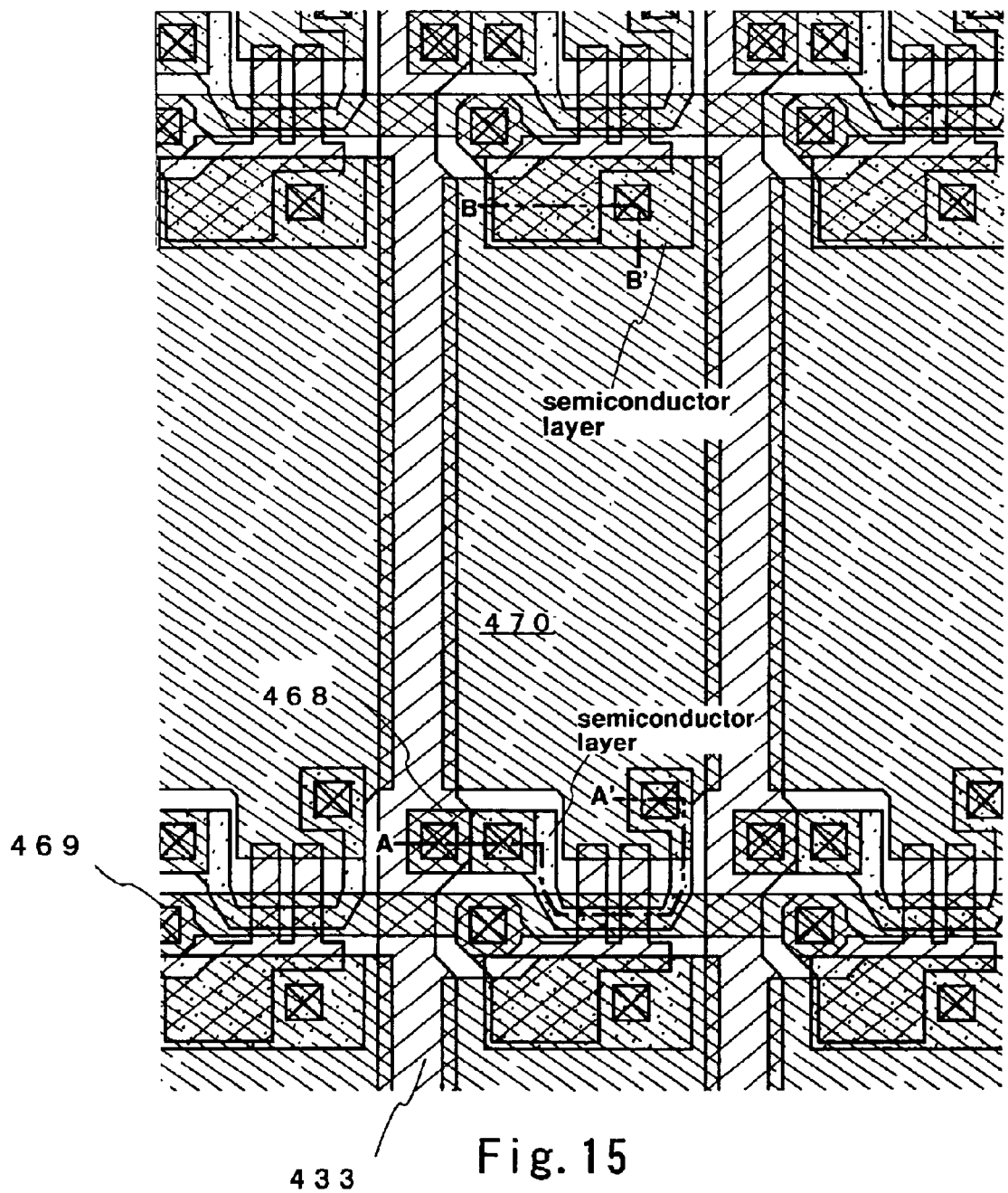
FIG. 15 is a top view showing the structure of a pixel TFT.

An upper surface diagram of the pixel portion of the active matrix substrate manufactured in this embodiment is shown in FIG. 15. Note that the same reference symbols are used for portions corresponding to those in FIGS. 12 to 15. A chain line A-A' in FIG. 14 corresponds to a cross sectional diagram cut along a chain line A-A' within FIG. 15. Further, a chain line B-B' in FIG. 14 corresponds to a cross sectional diagram cut along a chain line B-B' within FIG. 15.

Embodiment 8

Figure 16:
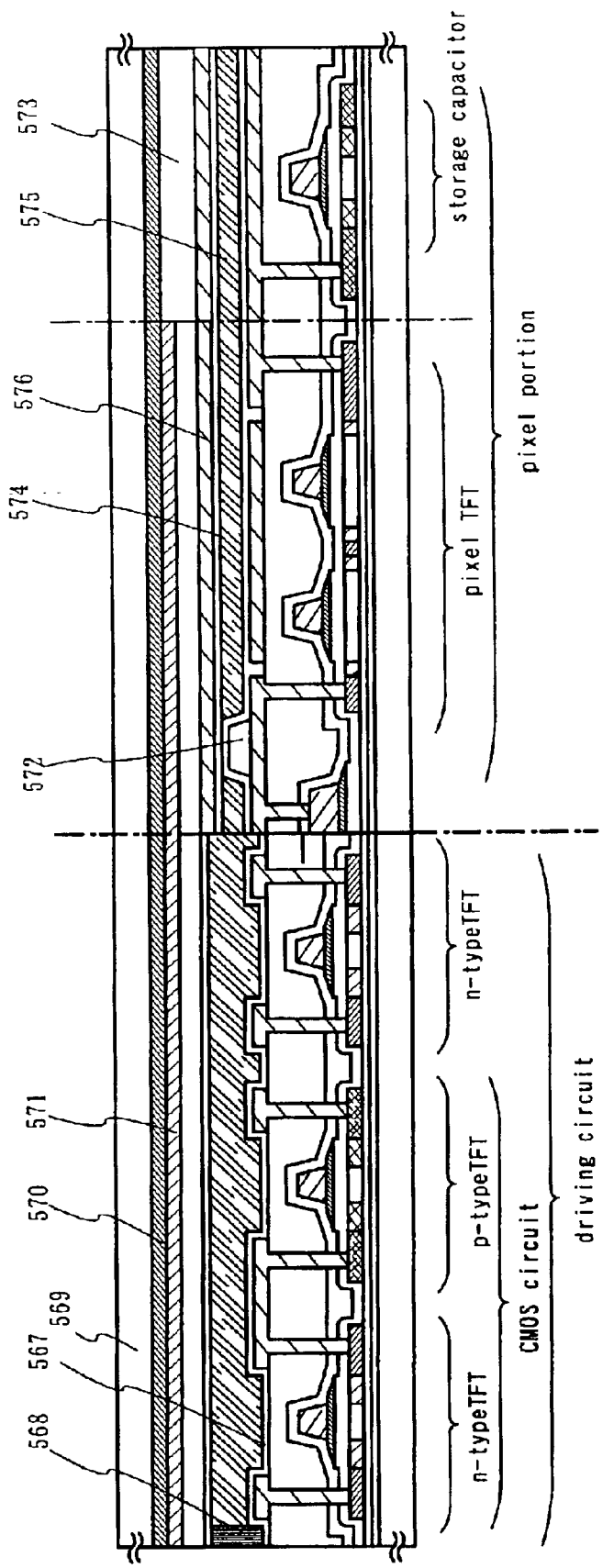
FIG. 16 is a sectional view of an active matrix liquid crystal display device.

In this embodiment, a manufacturing process of a reflection type liquid crystal display device from the active matrix substrate manufactured in accordance with Embodiment 7 will be described hereinbelow. FIG. 16 is used for an explanation thereof.

First, in accordance with Embodiment 5, an active matrix substrate in a state shown in FIG. 14 is obtained, and thereafter, an alignment film 567 is formed on the active matrix substrate of FIG. 14, at least on the pixel electrode 470, and is subjected to a rubbing process. Note that, in this embodiment, before the formation of the alignment film 567, a spacer 572 for maintaining a gap between the substrates is formed at a desired position by patterning an organic film such as an acrylic resin film. Further, spherical spacers may be scattered on the entire surface of the substrate in place of the columnar like spacer.

Next, an opposing substrate 569 is prepared. The colored layers 570, 571 and a leveling film 573 are formed on the opposing substrate 569. The red-colored layer 570 and the blue-colored layer 572 are partially overlapped with each other, thereby forming a light shielding portion. Note that, the red-colored layer and a green-colored layer are partially overlapped with each other, thereby forming a light shielding portion.

In this embodiment, the substrate shown in Embodiment 5 is used. Accordingly, in FIG. 15 showing a top view of the pixel portion in accordance with Embodiment 5, light shielding must be performed at least gaps between the gate wiring 469 and the pixel electrodes 470, a gap between the gate wiring 469 and the connection electrode 468, and a gap between the connection electrode 468 and the pixel electrode 470. In this embodiment, the opposing substrate and the active matrix substrate are stuck so that the light shielding portions from laminated layer of colored layer each other overlap with the positions which need to be shielded from light.

Like this, without forming a black matrix, the gaps between the respective pixels are shielded from light by the light shielding portion. As a result, the reduction of the manufacturing steps can be attained.

Next, the opposing electrode 576 from transparent conductive film is formed on the leveling film 573, at least on the pixel portion. The alignment film 574 on the entire surface of the opposing substrate and the rubbing process is performed.

Then, an active matrix substrate on which a pixel portion and a driver circuit are formed is stuck with the opposing substrate by a sealing agent 568. In the sealing agent 568, a filler is mixed, and the two substrates are stuck with each other while keeping a uniform gap by the effect of this filler and the columnar spacer. Thereafter, a liquid crystal material 575 is injected between both the substrates to encapsulate the substrates completely by an encapsulant (not illustrated). A known liquid crystal material may be used as the liquid crystal material 575. Thus, the reflection type liquid crystal display device shown in FIG. 16 is completed. Then, if necessary, the active matrix substrate or the opposing substrate may be parted into desired shapes. Further, a polarizing plate is adhered to only the opposing substrate (not illustrated). Then, an FPC is adhered using a known technique.

Thus formed liquid crystal display device have a TFT which is formed by using the semiconductor film conducted homogeneous annealing. Therefore, enough operating characteristics and reliability of the above-mentioned liquid crystal display device can be obtained. Such liquid crystal display device can be used as a display portion of various electronic device.

This embodiment can be combined with Embodiments 1 and 7 freely.

Embodiment 9

In this embodiment, the example of manufacturing the light-emitting device by using manufacturing method of TFT when forming the active matrix substrate shown in Embodiment 7 is described. In this specification, the light-emitting device is a generic name which is a display panel enclosing the light-emitting element between the substrate and the cover material and the display module mounted mounting an TFT on the display panel. The light-emitting element has a light-emitting layer containing an organic compound material which can obtain the electro luminescence generated by adding the electric field, the anode layer and the cathode layer. Further, in the luminescence in an organic compound, the luminescence (fluorescence light) when returning from the state of singlet exciton to the basic state and the luminescence (phosphorus light) when returning from the state of triplet exciton to the basic state. Either or both luminescence are contained.

Further, in this embodiment, the organic light-emitting layer is defined all layers formed between the anode and the cathode. The organic light-emitting layer is specifically including the light-emitting layer, the hole injection layer, the electron injection layer, the hole transport layer, the electron transport layer and the like. Basically, the light-emitting element have a structure which is constructed by the anode layer, the light-emitting layer and the cathode layer sequentially. Additionally, the light-emitting layer may have following two structures. The first structure is constructed sequentially by the anode layer, the hole injection layer, the light-emitting layer and the cathode layer. The second structure is sequentially constructed by the anode layer, the hole injection layer, the light-emitting layer, the electron injection layer, the cathode layer and the like.

Figure 17:
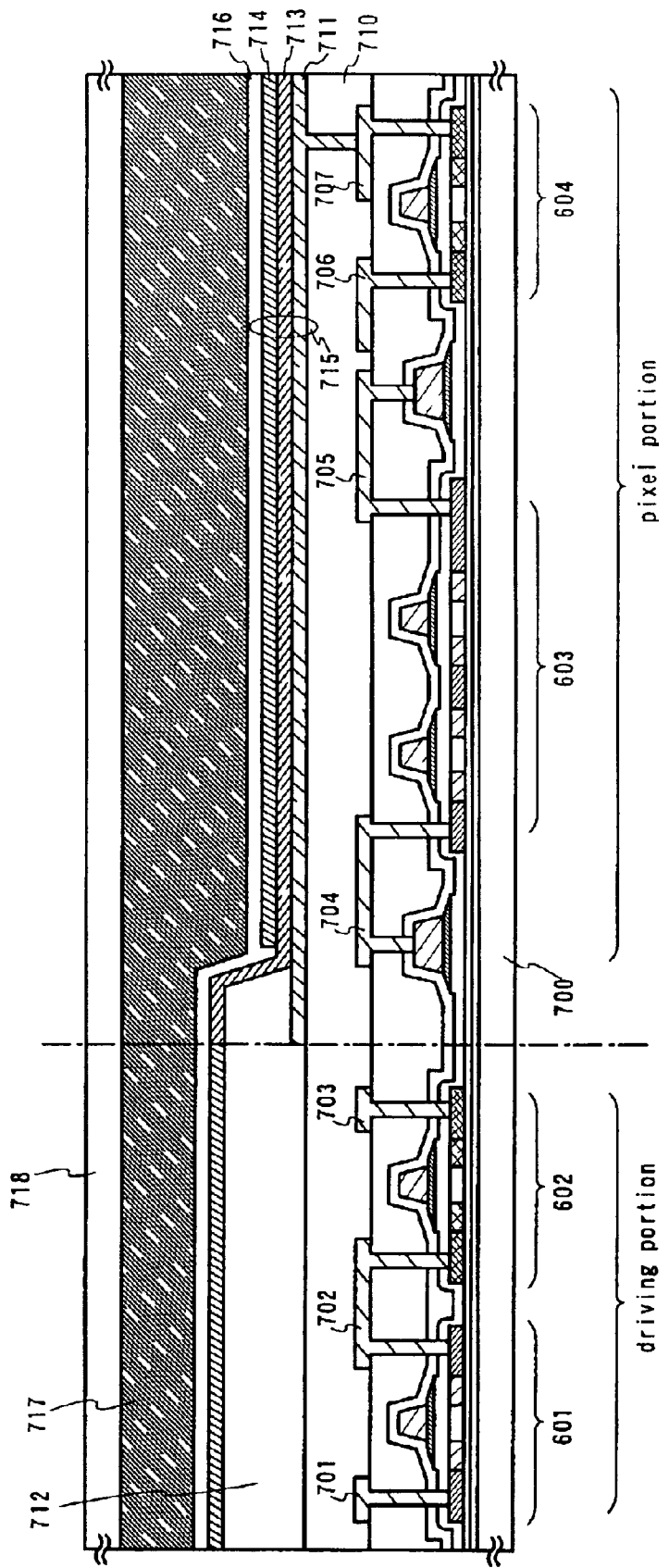
FIG. 17 is a sectional structural view of a driving circuit and pixel portion of a light emitting device.

FIG. 17 is a cross-sectional view of the light-emitting device of the present invention. In FIG. 17, a switching TFT 603 provided on a substrate 700 is formed using the n-channel type TFT 503 of FIG. 17. Thus, this structure may be referred to the description of the n-channel type TFT 503.

Note that, in this embodiment, a double gate structure in which two channel forming regions are formed is used. However, a single gate structure in which one channel forming region is formed, or a triple gate structure in which three channel forming regions are formed may be used.

A driver circuit provided on the substrate 700 is formed using the CMOS circuit of FIG. 14. Thus, this structure may be referred to the descriptions of the n-channel type TFT 501 and the p-channel type TFT 502. Note that, in this embodiment, the single gate structure is used. However, the double gate structure or the triple gate structure may also be used.

Also, wirings 701 and 703 function as a source wiring of the CMOS circuit, a wiring 702 functions as a drain wiring thereof. A wiring 704 functions as a wiring for electrically connecting a source wiring 708 with a source region of the switching TFT. A wiring 705 functions as a wiring for electrically connecting a drain wiring 709 with a drain region of the switching TFT.

Note that, a current-controlled TFT 604 is formed using the p-channel type TFT 502 of FIG. 14. Thus, this structure may be referred to the descriptions of the p-channel type TFT 502. Note that, in this embodiment, the single gate structure is used. However, the double gate structure or the triple gate structure may be used.

Also, a wiring 706 is a source wiring (corresponding to a current supply line) of the current-controlled TFT 604 and a wiring 707 is a drain wiring of the current-controlled TFT 604. Reference numeral 707 denotes an electrode which is electrically connected with a pixel electrode 711 by overlapping with the pixel electrode 711 of the current-controlled TFT 604.

Note that, reference numeral 711 denotes the pixel electrode (anode of a light-emitting element) made from a transparent conductive film. As the transparent conductive film, a compound of indium oxide and tin oxide, a compound of indium oxide and zinc oxide, zinc oxide, tin oxide, or indium oxide can be used. Also, the above-mentioned transparent conductive film to which gallium is added may be used. The pixel electrode 711 is formed on a level interlayer insulating film 710 before the formation of the above wirings. In this embodiment, it is very important to level a step in the TFT using the leveling film 710 made of resin. Since a light-emitting layer formed later is extremely thin, there is the case where insufficient light-emitting occurs due to the step. Thus, in order to form the light-emitting layer as level as possible, it is desired that the step is leveled before the formation of the pixel electrode 711.

After the wirings 701 to 707 are formed, a bank 712 is formed as shown in FIG. 17. The bank 712 may be formed by patterning an insulating film with a thickness of 100 to 400 nm containing silicon or an organic resin film.

Note that, since the bank 712 is an insulating film, it is necessary to pay attention to a dielectric breakdown of an element in the film formation. In this embodiment, a carbon particle or a metal particle is added to the insulating film which is a material of the bank 712 to reduce a resistivity. Thus, an electrostatic occurrence is suppressed. Here, an additional amount of the carbon particle or the metal particle may be controlled such that the resistivity is $1 \times 10^6$ to $1 \times 10^{12}$ Ωm (preferably, $1 \times 10^8$ to $1 \times 10^{10}$ Ωm).

A light emitting layer 713 is formed on the pixel electrode 710. Note that, only one pixel is shown in FIG. 17. However, in this embodiment, the light-emitting layers are formed corresponding to respective colors of R (red), G (green), and B (blue). Also, in this embodiment, a low molecular organic light-emitting material is formed by an evaporation method. Concretely, copper phthalocyanine (CuPc) film with a thickness of 20 nm is provided as a hole injection layer, and a tris-8-quinolinolate aluminum complex (Alq$_3$) film with a thickness of 70 nm is provided thereon as a light-emitting layer. Thus, a lamination structure of those films is formed. A light-emitting color can be controlled by adding a fluorochrome such as quinacridon, perylene, or DCM1 to Alq$_3$.

Note that, the above example is one example of the organic light-emitting material which can be used as the light-emitting layer, and it is unnecessary to be limited to this example. The light-emitting layer (layer for causing light to emit and a carrier to move for the emitting of light) may be formed by freely combining the light-emitting layer and a charge transport layer or a charge injection layer. For example, in this embodiment, although the example that the low molecular organic light-emitting material is used as the light-emitting layer is shown, intermediate molecular-weight organic light emitting material or a polymer organic light-emitting material may be also used. Furthermore, an organic light-emitting material, having no sublimation property but having molecules in the number of 20 or less or chained molecules having a length of 10 μm or less, is provided as a intermediate molecular organic light emitting material. For an example of using the high molecular weight organic light emitting material, a polythiophene (PEDOT) film with a thickness of 20 nm is formed by the spin coating method as a hole injection layer and the lamination structure installing paraphenylenvinylene (PPV) of about 100 nm on it as a light emitting layer may be good. The luminescence wave length can be selected from red to blue by using the π-conjugated type polymer of PPV. Meanwhile, it is possible to use an inorganic material such as silicon carbide for an electron transporting layer or charge injecting layer. These organic light emitting materials or inorganic materials can be a known material.

Next, a cathode 714 made from a conductive film is provided on the light-emitting layer 713. In the case of this embodiment, an alloy film of aluminum and lithium is used as the conductive film. Of course, a known MgAg film (alloy film of magnesium and silver) may be used. As a cathode material, the conductive film made of an element which belongs to group 1 or group 2 of the periodic table, or the conductive film to which those elements are added may be used.

When this cathode 714 is formed, a light-emitting element 715 is completed. Note that, the light-emitting element 715 completed here represents a diode formed by the pixel electrode (anode) 711, the light-emitting layer 713, and the cathode 714.

It is effective to provide a passivation film 716 so as to completely cover the light-emitting element 715. As the passivation film 716, a single layer of an insulating film containing a carbon film, a silicon nitride film, or silicon oxynitride film, or a lamination layer of a combination with the insulating film is used.

Here, it is preferred that a film with a good coverage is used as the passivation film, and it is effective to use the carbon film, in particular a DLC (diamond like carbon) film. Since the DLC film can be formed in a range of a room temperature to 100° C., it can be easily formed over the light-emitting layer 713 with a low heat-resistance. Also, since the DLC film has a high blocking effect against oxygen, the oxidation of the light-emitting layer 713 can be suppressed. Thus, the oxidation of the light-emitting layer 713 during the following sealing process can be prevented.

Further, a sealing member 717 is provided on the passivation film 716, and then a cover member 718 is adhered to the sealing member 717. Ultraviolet light cured resin may be used as the sealing member 717, and it is effective to provide a material having a hygroscopic effect or a material having an oxidation inhibition effect inside. Also, in this embodiment, a member in which a carbon film (preferably, a diamond carbon like film) is formed on both surfaces of, a glass substrate, a quartz substrate, or a plastic substrate (including a plastic film) is used as the cover member 718. Aluminum film(AlON, AlN, AlO and the like), SiN and the like can be used instead of a carbon film.

Thus, a light-emitting device of the structure as shown in FIG. 17 is completed. Note that, after the formation of the bank 712, it is effective to successively perform the processes until the formation of the passivation film 716 using a film formation apparatus of a multi chamber system (or an inline system) without exposing to air. Further, processes until the adhesion of the cover member 718 can be successively performed without exposing to air.

Thus, n-channel TFT 601, p-channel TFT 602, a switching TFT (n-channel TFT) 603, and a current control TFT (p-channel TFT) 604 are formed on the substrate 700.

Further, as described using FIG. 17, when the impurity regions overlapped with the gate electrode through the insulating film are provided, the n-channel TFT having a high resistant against the deterioration due to a hot carrier effect can be formed. Thus, the light-emitting device with high reliability can be realized.

In this embodiment, only the structures of the pixel portion and the driver circuit are shown. However, according to the manufacturing process of this embodiment, logic circuits such as a signal separation circuit, a D/A converter, an operational amplifier, a γ-correction circuit and the like can be further formed on the same insulating material. A memory and a microprocessor can be also formed.

Thus formed light-emitting device have a TFT which is formed by using the semiconductor film conducted homogeneous annealing. Therefore, enough operating characteristics and reliability of the above-mentioned light-emitting device can be obtained. Such light-emitting device can be used as a display portion of various electronic devices.

This embodiment can be performed by freely combining with Embodiments 1 to 7.

Embodiment 10

Various semiconductor devices (active matrix type liquid crystal display device, active matrix type light-emitting device or active matrix type EC display device) can be formed by applying the present invention. Specifically, the present invention can be embodied in electrooptics equipment of any type in which such an electrooptical device is incorporated in a display portion.

Such electronic equipment is a video camera, a digital camera, a projector, a head-mounted display (goggle type display), a car navigation system, a car stereo, a personal computer, or a mobile information terminal (such as a mobile computer, a mobile telephone, an electronic book and the like). FIGS. 18A–18F, 19A–19D, and 20A–20C show one of its examples.

FIG. 18A shows a personal computer which includes a body 3001, an image input portion 3002, a display portion 3003, a keyboard 3004 and the like. A personal computer completes by applying the semiconductor device that applies this invention to display portion 3003.

FIG. 18B shows a video camera which includes a body 3101, a display portion 3102, a sound input portion 3103, operating switches 3104, a battery 3105, an image receiving portion 3106 and the like. A video camera completes by applying the semiconductor device that applies this invention to display portion 3102.

FIG. 18C shows a mobile computer which includes a body 3201, a camera portion 3202, an image receiving portion 3203, an operating switch 3204, a display portion 3205 and the like. A mobile computer completes by applying the semiconductor device that applies this invention to display portion 3205.

FIG. 18D shows a goggle type display which includes a body 3301, a display portion 3302, arm portions 3303 and the like. A goggle type display completes by applying the semiconductor device that applies this invention to display portion 3302.

FIG. 18E shows a player using a recording medium on which a program is recorded (hereinafter referred to as the recording medium), and the player includes a body 3401, a display portion 3402, speaker portions 3403, a recording medium 3404, operating switches 3405 and the like. This player uses a DVD (Digital Versatile Disc), a CD and the like as the recording medium, and enables a user to enjoy music, movies, games and the Internet. A recording medium completes by applying the semiconductor device that applies this invention to display portion 3402.

FIG. 18F shows a digital camera which includes a body 3501, a display portion 3502, an eyepiece portion 3503, operating switches 3504, an image receiving portion (not shown) and the like. A digital camera completes by applying the semiconductor device that applies this invention to display portion 3502.

Figure 19A:
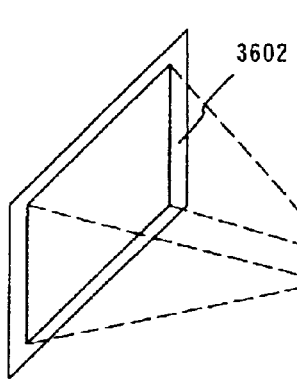
FIGS. 19A to 19D are diagrams showing examples of a semiconductor device.

FIG. 19A shows a front type projector which includes a projection device 3601, a screen 3602 and the like. A front type projector completes by applying the semiconductor device that applies this invention to a liquid crystal display device 3808 composing a part of a projection device 3601 as well as other driver circuit.

Figure 19B:
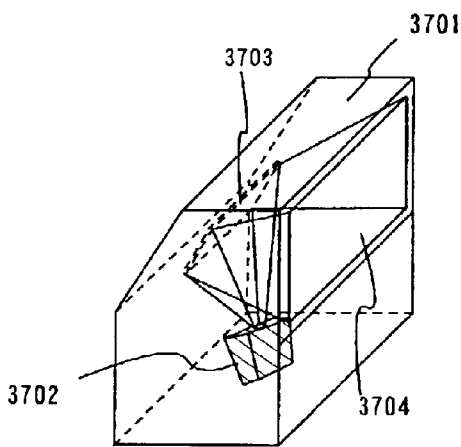

FIG. 19B shows a rear type projector which includes a body 3701, a projection device 3702, a mirror 3703, a screen 3704 and the like. A rear type projector completes by applying the semiconductor device that applies this invention to a liquid crystal display device 3808 composing a part of a projection device 3702 as well as other driver circuit.

Figure 19C:
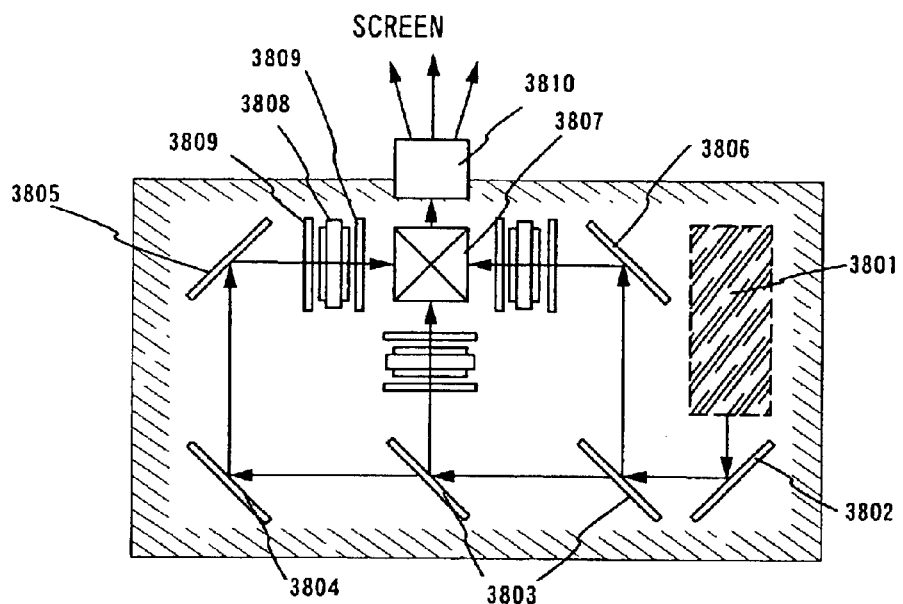

FIG. 19C shows one example of the structure of each of the projection devices 3601 and 3702 which are respectively shown in FIGS. 19A and 19B. Each of the projection devices 3601 and 3702 is made of a light source optical system 3801, mirrors 3802 and 3804–3806, a dichroic mirror 3803, a prism 3807, a liquid crystal display device 3808, a phase difference plate 3809 and a projection optical system 3810. The projection optical system 3810 is made of an optical system including a projection lens. Embodiment 10 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 19C.

Figure 19D:
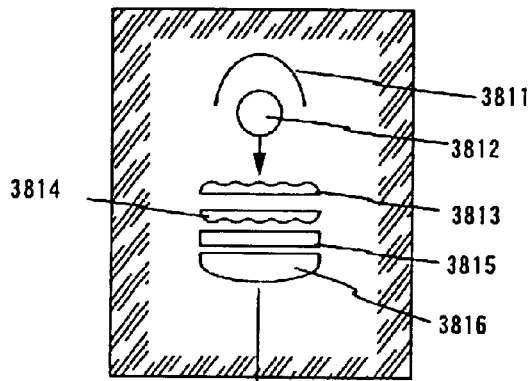

FIG. 19D is a view showing one example of the structure of the light source optical system 3801 shown in FIG. 19C. In Embodiment 10, the light source optical system 3801 is made of a reflector 3811, a light source 3812, lens arrays 3813 and 3814, a polarizing conversion element 3815 and a condenser lens 3816. Incidentally, the light source optical system shown in FIG. 19D is one example, and the invention is not particularly limited to the shown construction. For example, those who embody the invention may appropriately dispose an optical system such as an optical lens, a film having a polarization function, a film for adjusting phase difference or an IR film.

The projector shown in FIGS. 19A to 19D is of the type using a transparent type of electrooptical device, but there is not shown an example in which the invention is applied to a reflection type of electrooptical device and a light-emitting device.

Figure 20A:
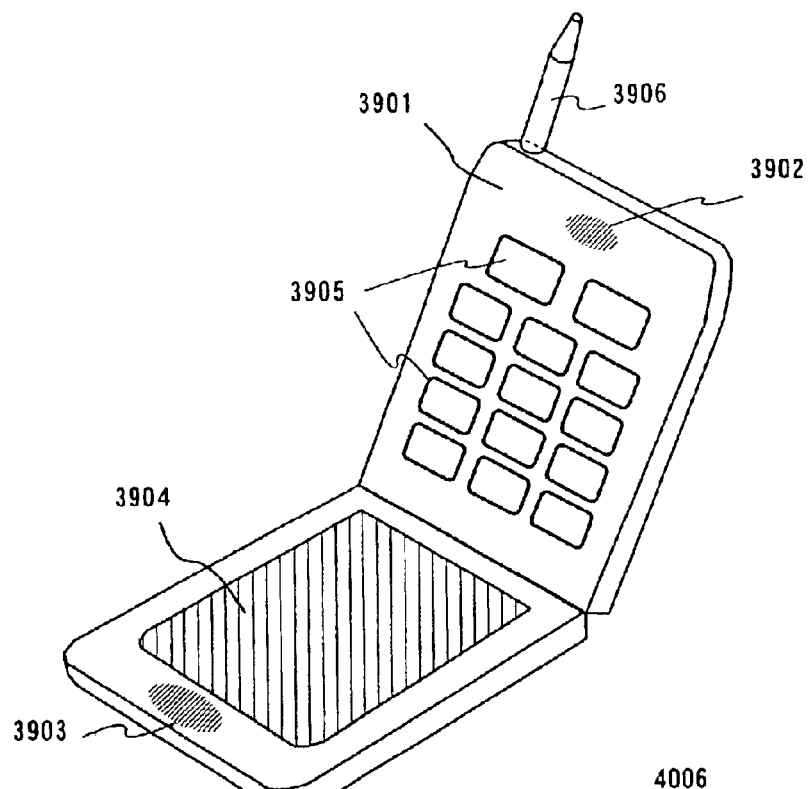
FIGS. 20A to 20C are diagrams showing examples of a semiconductor device.

FIG. 20A shows a cell phone which includes a body 3901, a sound output portion 3902, a sound input portion 3903, a display portion 3904, operating switches 3905, an antenna 3906 and the like. A cell phone completes by applying the semiconductor device that applies this invention to display portion 3904.

Figure 20B:
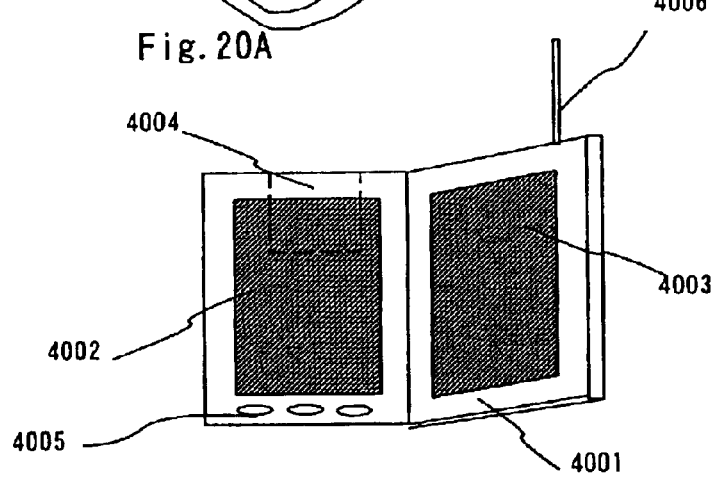

FIG. 20B shows a mobile book (electronic book) which includes body 4001, display portions 4002 and 4003, a storage medium 4004, operating switches 4005, an antenna 4006 and the like. A mobile book completes by applying the semiconductor device that applies this invention to display portion 4002 and 4003.

Figure 20C:
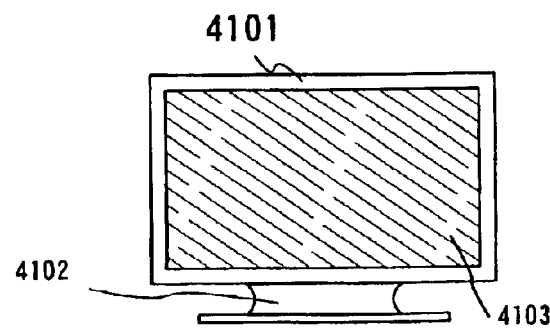

FIG. 20C shows a display which includes a body 4101, a support base 4102, a display portion 4103 and the like. A display completes by applying the semiconductor device that applies this invention to display portion 4103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 8 and 9.

Employing the structures of the present invention provides the following basic usefulness:

a) Laser light very excellent in uniformity of energy distribution can be formed on an irradiation surface or in the vicinity thereof and accordingly an irradiation object can be annealed uniformly.

b) Laser beams emitted from different lasers are synthesized and therefore interference does not take place, and this is effective especially when highly interferential lasers are used.

c) The throughput can be improved, which is effective particularly when a substrate has a large area.

d) With those advantages given in the above, the present invention can improve the operation characteristic and reliability of semiconductor devices, typically, active matrix liquid crystal display devices, and can lower manufacture cost of semiconductor devices.

What is claimed is:

1. A laser irradiation method comprising:

emitting a plurality of first laser light spots from a plurality of lasers;

cutting each of the plural first laser light spots emitted from the plural lasers to divide it into plural second laser light spots; and choosing one laser light spot out of the second laser light spots for each of the plural first laser light spots and synthesizing the chosen light spots in the same region on an irradiation surface.

2. A laser irradiation method comprising:

emitting a plurality of first laser light spots from a plurality of lasers;

cutting each of the plural first laser light spots emitted from the plural lasers to divide it into plural second laser light spots; and choosing one laser light spot out of the second laser light spots for each of the plural first laser light spots and synthesizing the chosen light spots in the same region on an irradiation surface, the chosen laser light spots having different energy distributions from one another.

3. A laser irradiation method according to claim 1, wherein laser light formed by synthesizing spots in the same region on the irradiation surface has a linear shape.

4. A laser irradiation method according to claim 2, wherein laser light formed by synthesizing spots in the same region on the irradiation surface has a linear shape.

5. A laser irradiation method according to claim 1, wherein the synthesizing means is one or more kinds selected from a mirror and a cylindrical lens.

6. A laser irradiation method according to claim 2, wherein the synthesizing means is one or more kinds selected from a mirror and a cylindrical lens.

7. A laser irradiation method comprising:

emitting a plurality of first laser light spots from a plurality of lasers;

cutting each of the plural first laser light spots emitted from the plural lasers to divide it into plural second laser light spots; and choosing one laser light spot out of the second laser light spots that have existed the convex lens and enter the irradiation surface at an angle for each of the plural first laser light spots and synthesizing the chosen light spots in the same region on an irradiation surface, wherein the laser light has a linear shape on the irradiation surface because of the convex lens.

8. A laser irradiation method comprising:

emitting a plurality of first laser light spots from a plurality of lasers;

cutting each of the plural first laser light spots emitted from the plural lasers to divide it into plural second laser light spots; and choosing one laser light spot out of the second laser light spots for each of the plural first laser light spots and synthesizing the chosen light spots in the same region on an irradiation surface, the chosen laser light spots having different energy distributions from one another, wherein the laser light has a linear shape on the irradiation surface because of the convex lens.

9. A laser irradiation method according to claim 7, wherein, when the beam length of the laser light entering an irradiation object set on a substrate is given as $W_1$, the beam length of a part of the laser light that is reflected at the back side of the substrate is given as $W_2$, the thickness of the substrate is given as d, and $w=(w_1+w_2)/2$, an incident angle $\theta$ of the laser light entering the irradiation object satisfies $\theta \geqq$ arctan $(W/(2\times d))$.

10. A laser irradiation method according to claim 8, wherein, when the beam length of the laser light entering an irradiation object set on a substrate is given as $w_1$, the beam length of a part of the laser light that is reflected at the back side of the substrate is given as $w_2$, the thickness of the substrate is given as d, and $w=(w_1+w_2)/2$, an incident angle $\theta$ of the laser light entering the irradiation object satisfies $\theta \geqq$ arctan $(W/(2\times d))$.

11. A laser irradiation method according to claim 7, wherein the incident angle $\theta$ of the laser light entering the irradiation object is Brewster angle.

12. A laser irradiation method according to claim 8, wherein the incident angle $\theta$ of the laser light entering the irradiation object is Brewster angle.

13. A laser irradiation method according to claim 1, wherein the dividing means is one or more kinds selected from a slit, a mirror, a prism, a cylindrical lens, and a cylindrical lens array.

14. A laser irradiation method according to claim 2, wherein the dividing means is one or more kinds selected from a slit, a mirror, a prism, a cylindrical lens, and a cylindrical lens array.

15. A laser irradiation method according to claim 7, wherein the dividing means is one or more kinds selected from a slit, a mirror, a prism, a cylindrical lens, and a cylindrical lens array.

16. A laser irradiation method according to claim 8, wherein the dividing means is one or more kinds selected from a slit, a mirror, a prism, a cylindrical lens, and a cylindrical lens array.

17. A laser irradiation method according to claim 1, wherein the laser irradiates the synthesized laser light having a linear shape and the irradiation object while moving relatively.

18. A laser irradiation method according to claim 2, wherein the laser irradiates the synthesized laser light having a linear shape and the irradiation object while moving relatively.

19. A laser irradiation method according to claim 7, wherein the laser irradiates the synthesized laser light having a linear shape and the irradiation object while moving relatively.

20. A laser irradiation method according to claim 8, wherein the laser irradiates the synthesized laser light having a linear shape and the irradiation object while moving relatively.

21. A laser irradiation method according to claim 1, wherein each of the lasers is a continuous wave or pulse oscillation solid-body laser, gas laser, or metal laser.

22. A laser irradiation method according to claim 2, wherein each of the lasers is a continuous wave or pulse oscillation solid-body laser, gas laser, or metal laser.

23. A laser irradiation method according to claim 7, wherein each of the lasers is a continuous wave or pulse oscillation solid-body laser, gas laser, or metal laser.

24. A laser irradiation method according to claim 8, wherein each of the lasers is a continuous wave or pulse oscillation solid-body laser, gas laser, or metal laser.

25. A laser irradiation method according to claim 1, wherein each of the lasers is selected from the group consisting of a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser.

26. A laser irradiation method according to claim 2, wherein each of the lasers is selected from the group consisting of a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser.

27. A laser irradiation method according to claim 7, wherein each of the lasers is selected from the group consisting of a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser.

28. A laser irradiation method according to claim 8, wherein each of the lasers is selected from the group consisting of a continuous wave or pulse oscillation YAG laser, $YVO_4$ laser, YLF laser, $YAlO_3$ laser, $Y_2O_3$ laser, glass laser, ruby laser, alexandrite laser, and Ti:sapphire laser.

29. A laser irradiation method according to claim 1, wherein each of the lasers is selected from the group consisting of an Ar laser, Kr, laser, and $CO_2$ laser.

30. A laser irradiation method according to claim 2, wherein each of the lasers is selected from the group consisting of an Ar laser, Kr, laser, and $CO_2$ laser.

31. A laser irradiation method according to claim 7, wherein each of the lasers is selected from the group consisting of an Ar laser, Kr, laser, and $CO_2$ laser.

32. A laser irradiation method according to claim 8, wherein each of the lasers is selected from the group consisting of an Ar laser, Kr, laser, and $CO_2$ laser.

33. A laser irradiation method according to claim 1, wherein each of the lasers is selected from the group consisting of a continuous wave or pulse oscillation helium cadmium laser, copper stream laser, and gold stream laser.

34. A laser irradiation method according to claim 2, wherein each of the lasers is selected from the group consisting of continuous wave or pulse oscillation helium cadmium laser, copper stream laser, and gold stream laser.

35. A laser irradiation method according to claim 7, wherein each of the lasers is selected from the group consisting of continuous wave or pulse oscillation helium cadmium laser, copper stream laser, and gold stream laser.

36. A laser irradiation method according to claim 8, wherein each of the lasers is selected from the group consisting of continuous wave or pulse oscillation helium cadmium laser, copper stream laser, and gold stream laser.

37. A laser irradiation method according to claim 1, wherein the laser light is converted into harmonic by a non-linear optical element.

38. A laser irradiation method according to claim 2, wherein the laser light is converted into harmonic by a non-linear optical element.

39. A laser irradiation method according to claim 7, wherein the laser light is converted into harmonic by a non-linear optical element.

40. A laser irradiation method according to claim 8, wherein the laser light is converted into harmonic by a non-linear optical element.

41. A method of manufacturing a semiconductor device, wherein a laser irradiation method of claim 1 is used to heat a semiconductor film.

42. A method of manufacturing a semiconductor device, wherein a laser irradiation method of claim 2 is used to heat a semiconductor film.

43. A method of manufacturing a semiconductor device, wherein a laser irradiation method of claim 7 is used to heat a semiconductor film.

44. A method of manufacturing a semiconductor device, wherein a laser irradiation method of claim 8 is used to heat a semiconductor film.

45. A method of manufacturing a semiconductor device, wherein a laser irradiation method of claim 1 is used to crystallize a semiconductor film.

46. A method of manufacturing a semiconductor device, wherein a laser irradiation method of claim 2 is used to crystallize a semiconductor film.

47. A method of manufacturing a semiconductor device, wherein a laser irradiation method of claim 7 is used to crystallize a semiconductor film.

48. A method of manufacturing a semiconductor device, wherein a laser irradiation method of claim 8 is used to crystallize a semiconductor film.

49. A method of manufacturing a semiconductor device, wherein a laser irradiation method of claim 1 is used to activate a semiconductor film.

50. A method of manufacturing a semiconductor device, wherein a laser irradiation method of claim 2 is used to activate a semiconductor film.

51. A method of manufacturing a semiconductor device, wherein a laser irradiation method of claim 7 is used to activate a semiconductor film.

52. A method of manufacturing, a semiconductor device, wherein a laser irradiation method of claim 8 is used to activate a semiconductor film.

53. A method of manufacturing a semiconductor device, wherein a laser irradiation method of claim 1 is used to crystallize a semiconductor film and the crystallized semiconductor film is activated.

54. A method of manufacturing a semiconductor device, wherein a laser irradiation method of claim 2 is used to crystallize a semiconductor film and the crystallized semiconductor film is activated.

55. A method of manufacturing a semiconductor device, wherein a laser irradiation method of claim 7 is used to crystallize a semiconductor film and the crystallized semiconductor film is activated.

56. A method of manufacturing a semiconductor device, wherein a laser irradiation method of claim 8 is used to crystallize a semiconductor film and the crystallized semiconductor film is activated.

* * * * *